United States Patent
Riemer et al.

(10) Patent No.: US 12,378,687 B2
(45) Date of Patent: Aug. 5, 2025

(54) HIGH ASPECT RATIO ELECTROPLATED STRUCTURES AND ANISOTROPIC ELECTROPLATING PROCESSES

(71) Applicant: Hutchinson Technology Incorporated, Hutchinson, MN (US)

(72) Inventors: Douglas P. Riemer, Waconia, MN (US); Kurt C. Swanson, Chippewa Falls, WI (US); Peter F. Ladwig, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

(21) Appl. No.: 16/827,583

(22) Filed: Mar. 23, 2020

(65) Prior Publication Data

US 2020/0232112 A1    Jul. 23, 2020

Related U.S. Application Data

(62) Division of application No. 15/817,049, filed on Nov. 17, 2017, now Pat. No. 10,640,879.

(60) Provisional application No. 62/423,995, filed on Nov. 18, 2016.

(51) Int. Cl.
   *C25D 5/02*   (2006.01)
   *C25D 5/18*   (2006.01)
   *C25D 7/00*   (2006.01)
   *H05K 3/10*   (2006.01)
   *H05K 3/24*   (2006.01)

(52) U.S. Cl.
   CPC .......... *C25D 5/02* (2013.01); *C25D 5/18* (2013.01); *C25D 7/00* (2013.01); *H05K 3/107* (2013.01); *H05K 3/241* (2013.01); *H05K 2203/0723* (2013.01); *Y10T 428/24917* (2015.01)

(58) Field of Classification Search
None
See application file for complete search history.

(56) References Cited

U.S. PATENT DOCUMENTS

| | | | |
|---|---|---|---|
| 4,315,985 A | 2/1982 | Castellani et al. | |
| 4,596,762 A | 6/1986 | Gruner | |
| 5,209,817 A | 5/1993 | Ahmad et al. | |
| 5,601,678 A | 2/1997 | Gerber et al. | |

(Continued)

FOREIGN PATENT DOCUMENTS

| | | |
|---|---|---|
| CN | 1528109 A | 9/2004 |
| CN | 1258777 C | 6/2006 |

(Continued)

OTHER PUBLICATIONS

English translation JP 2014080674 (Year: 2014).*

(Continued)

*Primary Examiner* — Stefanie S Wittenberg
(74) *Attorney, Agent, or Firm* — DLA Piper LLP (US)

(57) ABSTRACT

Devices including high-aspect ratio electroplated structures and methods of forming high-aspect ratio electroplated structures are described. A method for manufacturing metal structures includes providing a substrate having a metal base characterized by a height to width aspect ratio A/B and electroplating a metal crown on the base to form the metal structure with a height to width aspect ratio A/S greater than the aspect ratio A/B of the base.

18 Claims, 23 Drawing Sheets

(56) References Cited

U.S. PATENT DOCUMENTS

| | | |
|---|---|---|
| 5,661,086 A | 8/1997 | Nakashima et al. |
| 5,867,347 A | 2/1999 | Knight et al. |
| 6,239,979 B1 | 5/2001 | Ruff |
| 6,423,200 B1 | 7/2002 | Hymes |
| 6,600,404 B1 | 7/2003 | Kajino |
| 6,791,845 B2 | 9/2004 | Belopolsky |
| 7,027,141 B2 | 4/2006 | Girard et al. |
| 7,176,773 B2 | 2/2007 | Shoji |
| 7,384,531 B1 | 6/2008 | Peltoma et al. |
| 7,388,733 B2 | 6/2008 | Swanson et al. |
| 7,697,237 B1 | 4/2010 | Danielson |
| 7,929,252 B1 | 4/2011 | Hentges et al. |
| 8,144,430 B2 | 3/2012 | Hentges et al. |
| 8,169,746 B1 | 5/2012 | Rice et al. |
| 8,344,842 B1 | 1/2013 | Luzanov |
| 8,513,124 B1 | 8/2013 | Ponnuswamy et al. |
| 8,885,299 B1 | 11/2014 | Bennin et al. |
| 9,366,879 B1 | 6/2016 | Miller |
| 9,945,042 B2 | 4/2018 | Cha et al. |
| 9,976,224 B2 | 5/2018 | Jeong et al. |
| 10,109,409 B2 | 10/2018 | Lee et al. |
| 10,640,879 B2 | 5/2020 | Riemer et al. |
| 11,387,033 B2 | 7/2022 | Riemer et al. |
| 11,521,785 B2 | 12/2022 | Schumann et al. |
| 2002/0112963 A1 | 8/2002 | Nakano et al. |
| 2003/0188886 A1 | 10/2003 | Fey et al. |
| 2004/0159257 A1 | 8/2004 | Mathieu |
| 2004/0164835 A1 | 8/2004 | Shoji |
| 2004/0183743 A1 | 9/2004 | Reasoner et al. |
| 2005/0141138 A1 | 6/2005 | Shiraishi et al. |
| 2005/0173152 A1 | 8/2005 | Post et al. |
| 2005/0263389 A1 | 12/2005 | Gung et al. |
| 2006/0012005 A1 | 1/2006 | Leib et al. |
| 2006/0027393 A1* | 2/2006 | Aonuma ............... H05K 3/242 |
| | | 174/250 |
| 2006/0118905 A1 | 6/2006 | Himori et al. |
| 2007/0164867 A1 | 7/2007 | Kawai |
| 2008/0007473 A1 | 1/2008 | Yosui et al. |
| 2008/0020641 A1 | 1/2008 | Hiew et al. |
| 2009/0096092 A1* | 4/2009 | Patel ..................... H01L 24/13 |
| | | 257/737 |
| 2010/0051334 A1 | 3/2010 | Ho et al. |
| 2010/0132997 A1 | 6/2010 | Hando |
| 2010/0265078 A1 | 10/2010 | Friedman |
| 2010/0271161 A1 | 10/2010 | Yan et al. |
| 2012/0098728 A1 | 4/2012 | Kato et al. |
| 2012/0168921 A1 | 7/2012 | Tan et al. |
| 2013/0222101 A1 | 8/2013 | Ito et al. |
| 2013/0333820 A1* | 12/2013 | Sherrer ................ H01F 41/042 |
| | | 156/60 |
| 2014/0043129 A1 | 2/2014 | Wi et al. |
| 2014/0104133 A1 | 4/2014 | Finn et al. |
| 2014/0141548 A1 | 5/2014 | Mostoller et al. |
| 2014/0146649 A1 | 5/2014 | Bennin et al. |
| 2014/0183751 A1 | 7/2014 | Yoshioka et al. |
| 2014/0239457 A1 | 8/2014 | Daubenspeck et al. |
| 2014/0241574 A1 | 8/2014 | Wang et al. |
| 2014/0247101 A1 | 9/2014 | Cha et al. |
| 2015/0028107 A1 | 1/2015 | Fischer et al. |
| 2015/0035640 A1 | 2/2015 | Wang et al. |
| 2015/0036540 A1 | 2/2015 | Kasslin et al. |
| 2015/0047888 A1 | 2/2015 | Yoon et al. |
| 2015/0170823 A1* | 6/2015 | Jeong .................... C25D 7/001 |
| | | 336/200 |
| 2015/0270053 A1* | 9/2015 | Cha ......................... C25D 5/02 |
| | | 336/192 |
| 2015/0303065 A1* | 10/2015 | Buckalew ............. C25D 5/022 |
| | | 438/474 |
| 2016/0163444 A1 | 6/2016 | Choi et al. |
| 2016/0167958 A1 | 6/2016 | Shkel et al. |
| 2016/0293320 A1 | 10/2016 | Kim et al. |
| 2017/0150608 A1 | 5/2017 | Yoon et al. |
| 2018/0054900 A1 | 2/2018 | Ueda et al. |
| 2018/0211762 A1 | 7/2018 | Jung et al. |
| 2019/0082542 A1 | 3/2019 | Yosui et al. |
| 2020/0090852 A1 | 3/2020 | Riemer et al. |
| 2020/0090854 A1 | 3/2020 | Schumann et al. |
| 2021/0336197 A1 | 10/2021 | Sun |
| 2022/0351893 A1 | 11/2022 | Riemer et al. |
| 2023/0071114 A1 | 3/2023 | Schumann et al. |
| 2024/0170208 A1 | 5/2024 | Riemer et al. |

FOREIGN PATENT DOCUMENTS

| | | |
|---|---|---|
| CN | 201051498 Y | 4/2008 |
| CN | 104347262 A | 2/2015 |
| CN | 105097187 A | 11/2015 |
| CN | 105316714 A | 2/2016 |
| CN | 206272920 U | 6/2017 |
| CN | 110140203 A | 8/2019 |
| EP | 0 232 037 A2 | 8/1987 |
| EP | 1 648 208 A1 | 4/2006 |
| JP | 60-230993 A | 11/1985 |
| JP | 64-4091 A | 1/1989 |
| JP | 3-169249 A | 7/1991 |
| JP | 4-137405 A | 5/1992 |
| JP | 5-48247 A | 2/1993 |
| JP | 11-113231 A | 4/1999 |
| JP | 11-259883 A | 9/1999 |
| JP | 2005-236158 A | 9/2005 |
| JP | 2008-191266 A | 8/2008 |
| JP | 2010-62325 A | 3/2010 |
| JP | 2010-67317 A | 3/2010 |
| JP | 2010-118367 A | 5/2010 |
| JP | 2011-82302 A | 4/2011 |
| JP | 2012-14754 A | 1/2012 |
| JP | 2012-221518 A | 11/2012 |
| JP | 2013-228504 A | 11/2013 |
| JP | 2014-49170 A | 3/2014 |
| JP | 2014-80674 A | 5/2014 |
| JP | 2015-138054 A | 7/2015 |
| JP | 5776867 B1 | 9/2015 |
| JP | 2015-228477 A | 12/2015 |
| JP | 2016-72615 A | 5/2016 |
| JP | 2016-192516 A | 11/2016 |
| JP | 2017-227850 A | 12/2017 |
| JP | 2018-113434 A | 7/2018 |
| JP | 2018-121047 A | 8/2018 |
| KR | 2001-0092786 A | 10/2001 |
| KR | 10-2004-0040443 A | 5/2004 |
| KR | 10-2019-0082295 A | 7/2019 |
| TW | 201034546 A | 9/2010 |
| WO | 2015/079773 A1 | 6/2015 |
| WO | 2018/097112 A1 | 5/2018 |
| WO | WO 2018/094280 A1 | 5/2018 |

OTHER PUBLICATIONS

Andricacos, P.C. et al., "Damascene Copper Electroplating for Chip Interconnections", IBM Journal of Research and Development, vol. 42, No. 5, pp. 567-574, Sep. 1998.

Moffat, T.P. et al., "Curvature Enhanced Adsorbate Coverage Mechanism for Bottom-Up Superfilling and Bump Control in Damascene Processing", Electrochimica Acta, vol. 53, Issue 1, pp. 145-154, Nov. 2007.

Romankiw, L.T. et al., "Thin Film Magnetic Heads—Early Inventions and Their Ongoing Impact on Magnetic Storage and Electrochemistry", ECS Transactions, vol. 50, Issue 10, pp. 3-17, 2012.

Vereecken, P.M., et al., "The Chemistry of Additives in Damascene Copper Plating", IBM Journal of Research and Development, vol. 49, No. 1, pp. 3-18, Jan. 2005.

International Search Report and Written Opinion in International Application No. PCT/US2017/062416, mailed Jan. 25, 2018.

International Preliminary Report on Patentability in International Application No. PCT/US2017/062416 dated May 31, 2019.

International Search Report and Written Opinion in International Application No. PCT/US2019/062885, mailed Feb. 7, 2020.

International Search Report and Written Opinion in International Application No. PCT/US2019/062883, mailed Feb. 7, 2020.

Office Action for U.S. Appl. No. 15/817,049 dated Apr. 3, 2019.

(56) References Cited

OTHER PUBLICATIONS

Office Action for U.S. Appl. No. 15/817,049 dated Jul. 18, 2019.
Notice of Allowance for U.S. Appl. No. 15/817,049 dated Dec. 20, 2019.
Office Action for U.S. Appl. No. 16/693,169 dated Apr. 7, 2020.
Office Action for U.S. Appl. No. 16/693,169 dated Jul. 16, 2020.
Office Action for U.S. Appl. No. 16/693,125 dated Mar. 23, 2020.
Office Action for U.S. Appl. No. 16/693,125 dated Jul. 16, 2020.
Office Action for U.S. Appl. No. 16/693,169 dated Jan. 28, 2021.
Office Action for U.S. Appl. No. 16/693,125 dated Jan. 28, 2021.
International Preliminary Report on Patentability in International Application No. PCT/US2019/062885, mailed Jun. 10, 2021.
International Preliminary Report on Patentability in International Application No. PCT/US2019/062883, mailed Jun. 10, 2021.
Notice of Reasons for Refusal in Japanese Application No. 2019-526467, dated Sep. 21, 2021.
Office Action for U.S. Appl. No. 16/693,169 dated Aug. 24, 2021.
Office Action for U.S. Appl. No. 16/693,125 dated Aug. 24, 2021.
Notice of Preliminary Rejection in Korean Application No. 10-2019-7016946, dated Jan. 2, 2022.
Office Action for U.S. Appl. No. 16/693,125 dated Feb. 14, 2022.
Notice of Allowance for U.S. Appl. No. 16/693,169 dated Mar. 9, 2022.
Notice of Decision of Refusal in Japanese Application No. 2019-526467, dated Apr. 12, 2022.
Notice of Final Rejection in Korean Application No. 10-2019-7016946, dated Mar. 21, 2023.
Office Action in Chinese Application No. 201780082271.8, dated Apr. 14, 2023.
Office Action in Chinese Application No. 201980089827.5, dated Mar. 3, 2023.
Office Action in Chinese Application No. 201780082271.8, dated Sep. 15, 2022.
Notice of Final Rejection in Korean Application No. 10-2019-7016946, dated Nov. 22, 2022.
Notice of Allowance for U.S. Appl. No. 16/693,125 dated Aug. 3, 2022.
Office Action in Chinese Application No. 201780082271.8, dated Jul. 29, 2023.
Office Action in Taiwan Application No. 108143005, dated Jul. 14, 2023.
Notice of Reasons for Refusal in Japanese Application No. 2022-127306, dated Jun. 6, 2023.
Notice of Reasons for Refusal in Japanese Application No. 2021-529402, dated Sep. 5, 2023.
Notification of Reexamination in Chinese Application No. 201780082271.8, dated Apr. 19, 2024.
Notice of Allowance in Japanese Application No. 2021-529402, dated Apr. 30, 2024.
Notice of Preliminary Rejection in Korean Application No. 10-2021-7019812, dated Mar. 4, 2024.
Office Action in Taiwan Application No. 108143004, dated Feb. 6, 2024.
Office Action in Chinese Application No. 201980089827.5, dated Mar. 22, 2024.
Notice of Reasons for Rejection in Japanese Application No. 2021-531026, dated Mar. 26, 2024.
Notice of Preliminary Rejection in Korean Application No. 10-2021-7020023, dated Mar. 4, 2024.
Substantive Examination Report in Philippines Application No. 1-2021-551247, dated Mar. 5, 2024.
Notice of Decision of Refusal in Japanese Application No. 2022-127306, dated Apr. 23, 2024.
Notice of Preliminary Rejection in Korean Application No. 10-2023-7028302, dated Mar. 10, 2024.
International Search Report and Written Opinion in International Application No. PCT/US2023/079929, mailed Mar. 27, 2024.
Office Action for U.S. Appl. No. 17/985,715 dated Apr. 19, 2024.
Notice of Reasons for Refusal in Japanese Application No. 2019-526467, dated Oct. 3, 2023.
Office Action in Chinese Application No. 201980089815.2, dated Dec. 26, 2023.
Office Action in Taiwan Application No. 108143004, dated Sep. 5, 2023.
Office Action in Chinese Application No. 201980089827.5, dated Oct. 16, 2023.
Notice of Reasons for Rejection in Japanese Application No. 2021-531026, dated Oct. 3, 2023.
Notice of Reasons for Refusal in Japanese Application No. 2022-127306, dated Oct. 24, 2023.
Decision of Reexamination in Chinese Application No. 201780082271.8, dated Jun. 26, 2024.
Office Action in Chinese Application No. 201980089815.2, dated Jul. 26, 2024.
Notice of Allowance in Japanese Application No. 2021-531026, dated Oct. 8, 2024.
Notice of Allowance in Korean Application No. 10-2021-7020023, dated Oct. 8, 2024.
Office Action for U.S. Appl. No. 17/985,715 dated Aug. 12, 2024.
Notice of Reasons for Refusal in Japanese Application No. 2019-526467, dated Jun. 11, 2024.
Notice of Allowance in Philippines Application No. 1-2021-551247, dated May 23, 2024.
Rejection Decision in Taiwan Application No. 108143005, dated Apr. 16, 2024.
Office Action in Taiwan Application No. 112140035, dated May 31, 2024.
Office Action for U.S. Appl. No. 17/862,183 dated Aug. 5, 2024.

\* cited by examiner

901

Figure 21a

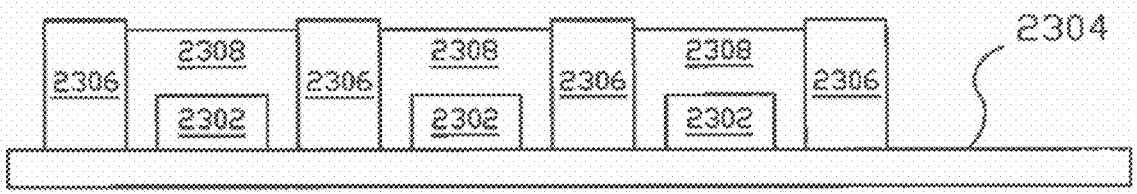

Figure 21b

| Step | Bath Component | Preferred | Unit | Range or comment |
|---|---|---|---|---|
| Crown plating and optionally Formation of Metal Layer and Conformal Plating | | | | |
| (all steps with one plating bath for some embodiments) | | | | |
| | Copper | 12 | g/liter | will depend on fluid velocity at article to plate. Low velocity will require a higher copper content, higher will require less copper. Also depends on current carrying capacity of item to plate. A low capacity will require less copper in bath. |
| | Acid | 1.8 | Molar | 1 to 2.5 molar |
| | Chlorides | 50 | ppm | 30 to 90 |
| | SPS (or MPS, DPS, or similar brightener) | 20 | ppm | 5-50 ppm range - Some embodiments may use up to 100 ppm |
| | PEG (PPG, EPE, Pluronic) | 500 | ppm | 100-750 range |
| | Leveler | 0 | ppm | As little as possible |
| Formation of Metal Layer | | | | |
| | Copper | 32 | g/liter | range is broad 10 to 40 g/L |
| | Acid | 1.8 | Molar | range is broad 0.5 to 2.5 molar |
| | Chlorides | 50 | ppm | 30 to 90 ppm |
| | SPS (or MPS, DPS, or similar brightener) | 20 | ppm | 5-50 ppm range - have seen some papers where even 100 ppm is used |
| | PEG (PPG, EPE, Pluronic) | 400 | ppm | 100-750 range |
| | Leveler | 2 | ppm | High concentration causes edges to round down - desirable, too little will cause edges to curve up - undesirable |
| Conformal Plating | | | | |
| | Copper | 32 | g/liter | range is broad 10 to 40 g/L, but low copper content limits plating rate and throughput suffers |
| | Acid | 1.8 | Molar | range is broad 0.5 to 2.5 molar |
| | Chlorides | 50 | ppm | 30 to 90 ppm |
| | SPS (or MPS, DPS, or similar brightener) | 20 | ppm | 5-50 ppm range - have seen some papers where even 100 ppm is used |
| | PEG (PPG, EPE, Pluronic) | 400 | ppm | 100-750 range |
| | Leveler | 2 | ppm | High concentration helps keep plating uniform on sides and top and allows higher machine throughput |

HIGH ASPECT RATIO ELECTROPLATED STRUCTURES AND ANISOTROPIC ELECTROPLATING PROCESSES

CROSS-REFERENCE TO RELATED APPLICATIONS

This application is a Divisional of U.S. patent application Ser. No. 15/817,049, filed on Nov. 17, 2017, which claims priority from U.S. Provisional Patent Application No. 62/423,995, filed on Nov. 18, 2016, each of which is hereby incorporated by reference in its entirety.

FIELD

The invention relates generally to electroplated structures and electroplating processes.

BACKGROUND

Electroplating processes for manufacturing structures such as copper or copper alloy circuit structures such as leads, traces and via interconnects are generally known and disclosed, for example, in the Castellani et al. U.S. Pat. No. 4,315,985 entitled fine-Line Circuit Fabrication and Photoresist Application Therefor. Processes of these types are, for example, used in connection with the manufacture of disk drive head suspensions as disclosed in the following patents: Bennin et al. U.S. Pat. No. 8,885,299 entitled Low Resistance Ground Joints for Dual Stage Actuation Disk Drive Suspensions; Rice et al. U.S. Pat. No. 8,169,746 entitled Integrated Lead Suspension with Multiple Trace Configurations; Hentges et al. U.S. Pat. No. 8,144,430 entitled Multi-Layer Ground Plane Structures for Integrated Lead Suspensions; Hentges et al. U.S. Pat. No. 7,929,252 entitled Multi-Layer Ground Plane Structures for Integrated Lead Suspensions; Swanson et al. U.S. Pat. No. 7,388,733 entitled Method for Making Noble Metal Conductive Leads for Suspension Assemblies; and Peltoma et al. U.S. Pat. No. 7,384,531 entitled Plated Ground Features for Integrated Lead Suspensions. Processes of these types are used also in connection with the manufacture of camera lens suspensions as disclosed, for example, in the Miller U.S. Pat. No. 9,366,879 entitled Camera Lens Suspension with Polymer Bearings.

Superfilling and superconformal plating processes and compositions are also known and disclosed, for example, in the following articles: Vereecken et al, "The chemistry of additives in damascene copper plating," IBM J. of Res. & Dev., vol. 49, no. 1, January 2005; Andricacos et al. "Damascene copper electroplating for chip interconnections," IBM J. of Res. & Dev., vol. 42, no. 5, September 1998; and Moffat et al., "Curvature enhanced adsorbate coverage mechanism for bottom-up superfilling and bump control in damascene processing," Electrochimica Acta 53, pp. 145-154, 2007. By these processes, electroplating inside trenches (e.g., photoresist mask trenches defining spaces for the structures to be electroplated) occurs preferentially in the bottom. Voids in the deposited structures can thereby be avoided. All of the above-identified patents and articles are hereby incorporated by reference in their entireties and for all purposes.

There remains a continuing need for enhanced circuit structures. There is also a continuing need for efficient and effective processes, including electroplating processes, for manufacturing circuit and other structures.

SUMMARY

Devices including high-aspect ratio electroplated structures and methods of forming high-aspect ratio electroplated structures are described. A method for manufacturing metal structures includes providing a substrate having a metal base characterized by a height to width aspect ratio and electroplating a metal crown on the base to form the metal structure with a height to width aspect ratio greater than the aspect ratio of the base.

Other features and advantages of embodiments of the present invention will be apparent from the accompanying drawings and from the detailed description that follows.

BRIEF DESCRIPTION OF THE DRAWINGS

Embodiments of the present invention are illustrated, by way of example and not limitation, in the figures of the accompanying drawings, in which like references indicate similar elements and in which:

FIGS. 21a,b illustrate a process for forming high-aspect ratio electroplated structures according to an embodiment using photoresist during a conformal plating process;

FIG. 22 illustrates exemplary chemistries used for a process to form the initial metal layer, a standard/conformal plating process, and a crown plating process according to various embodiments;

DETAILED DESCRIPTION

High-aspect ratio electroplated structures and methods of manufacturing in accordance with embodiments of the invention are described. The high-aspect ratio electroplated structures provide tighter conductor pitch than current technologies. For example, high-aspect ratio electroplated structures, according to various embodiments, include a conductor stack with a cross-sectional area of the conductor stack that is greater than 50%. Moreover, the high-aspect ratio electroplated structures enable multiple layers of conductors according to embodiments. Further, the high-aspect ratio electroplated structures, according to various embodiments, enable precision alignment from layer to layer. For example, the high-aspect ratio electroplated structure can have alignment of less than 0.030 mm from layer to layer. The high-aspect ratio electroplated structures, according to various embodiments, enable reduced overall stack height.

The high-aspect ratio electroplated structures, according to various embodiments, enable thin dielectric material between a coil formed using the high-aspect ratio electroplated structures and a magnet. This enables the coil to produce stronger electro-magnetic fields than current printed circuit coils, such as those illustrated in FIG. 1. Thus, the high-aspect ratio electroplated structures are more cost effective, produce higher performance devices, and reduce the required footprint of devices over current technologies.

Figure 2:
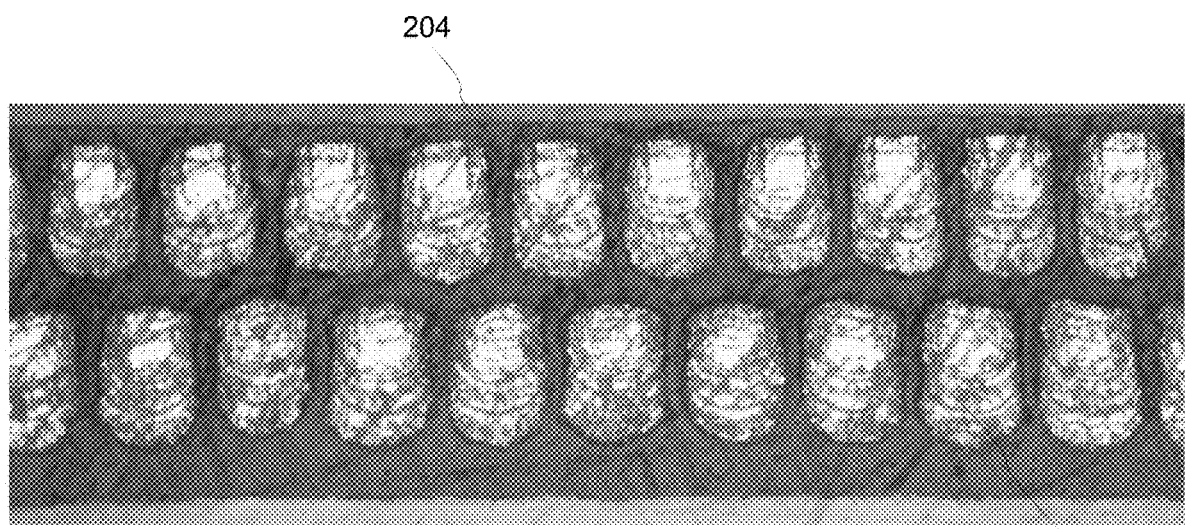
FIG. 2 illustrates a high-density precision coil including high-aspect ratio electroplated structures according to an embodiment.

FIG. 2 illustrates a high-density precision coil including high-aspect ratio electroplated structures according to an embodiment. The high-aspect ratio electroplated structures 202 are formed in a row with a dielectric material in between each row and each high-aspect ratio electroplated structure 204. The high-density precision coil can be formed as helical coils or other coil types.

Figure 3:
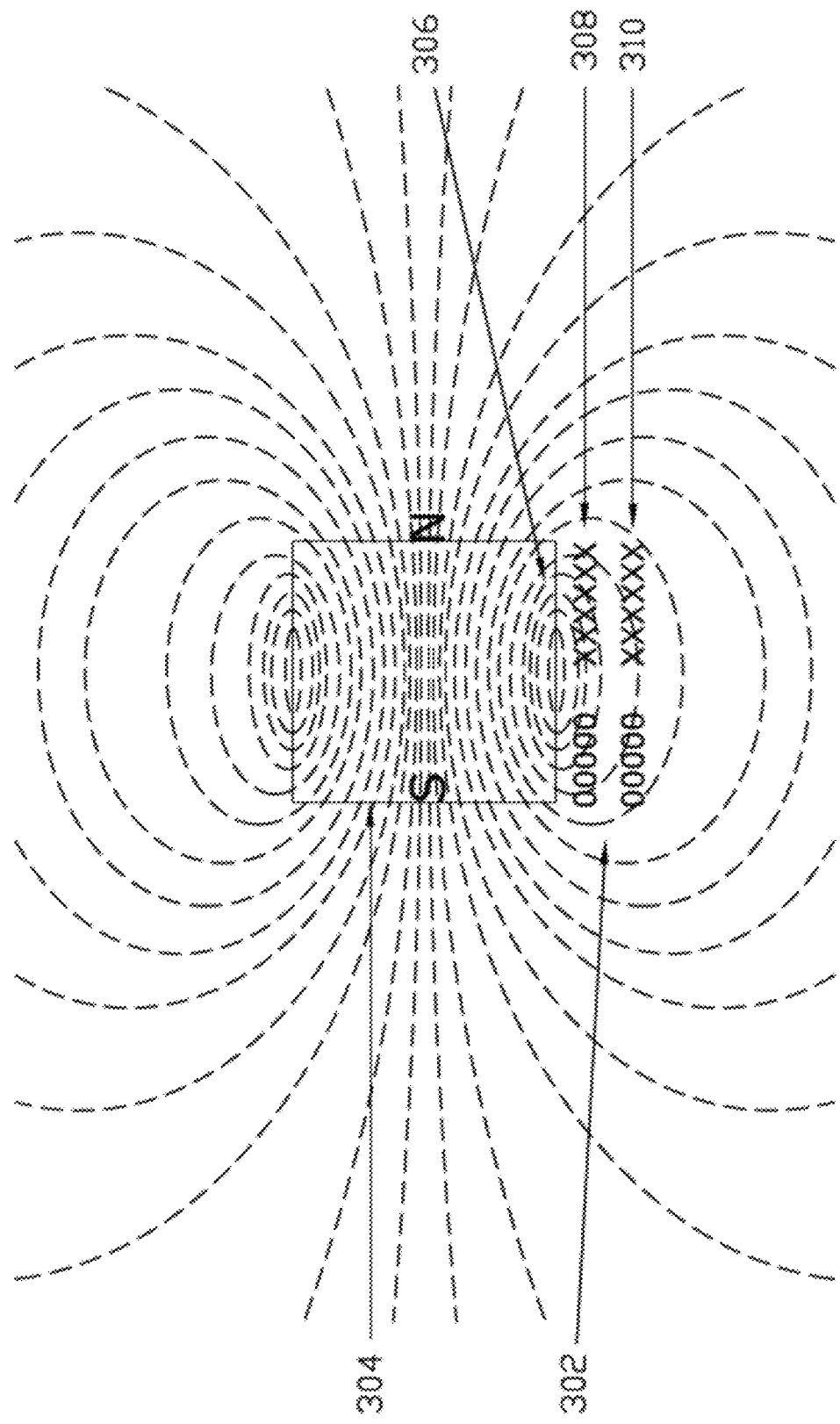
FIG. 3 illustrates a diagram used to represent the electromagnetic force generated by a high-density precision coil including high-aspect ratio electroplated structures according to an embodiment.

FIG. 3 illustrates a diagram used to represent the electromagnetic force generated by a high-density precision coil including high-aspect ratio electroplated structures according to an embodiment. The diagram includes a coils cross-section 302 in proximity of a magnet 304. The highest electro-magnetic force 306 is in the coil layer nearer 308 to the magnet 304. The coil layer 310 further from the magnet 304 applies less force. Primary factors that affect force come from the Lorentz equation: $\vec{F} = \vec{J} \times \vec{B}$. Because the strength of the magnitude of $\vec{B}$ decreases with distance between the coil and magnet, so $\vec{J}$ is the current flowing through the copper. Any area of cross section 302 that is not a conductor does not contribute to the force ($\vec{F}$).

Primary factors that affect force capability of a coil include the number of turns within a magnetic field (turns nearest the poles of the magnet provide the greatest force), the distance of the coil from the magnet (layers closed to the magnet will apply more force), and the total percent of copper cross-section area within the magnetic field. The use of high-aspect ratio electroplated structures according to various embodiments improves these aspects in comparison to coils using current coil technologies.

For example, a coil having two layers using current technologies has an overall thickness of approximately 210 micrometers, a conductor pitch of 38 micrometers, a cross section percentage of copper of approximately 20%, an estimated resistance of 3.1 ohms, an estimated force ratio of 1.0 (estimated B ratio of 1.0 and estimated J ratio of 1.0), and an estimated power ratio of 1.0. In comparison, a high density precision coil including high-aspect ratio electroplated structures, according to various embodiments, has an overall thickness of approximately 116 micrometers, a conductor pitch of 40 micrometers, a cross section percentage of copper of approximately 60%, an estimated resistance of 5.5 ohms, an estimated force ratio of 1.2 (estimated B ratio of 1.5 and estimated J ratio of 0.8), and an estimated power ratio of 0.71. Thus, a high density precision coil including high-aspect ratio electroplated structures, according to various embodiments, is a higher performance device. So, such a high density person coil, according to some embodiments, provides 20% more force with 30% less power in half the thickness of a coil using current state of the art techniques.

Figure 1:
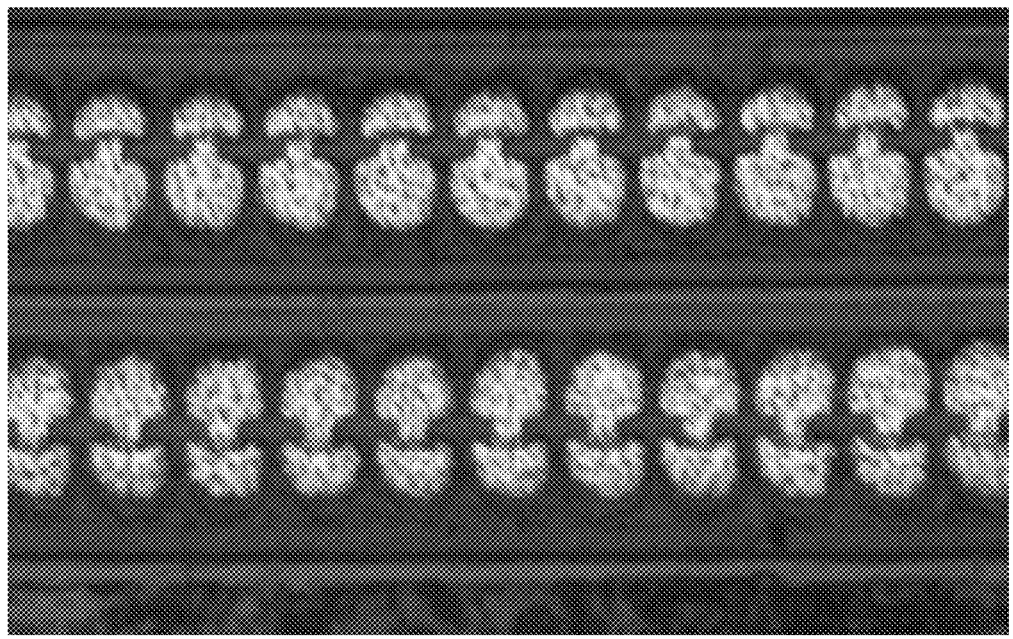
FIG. 1 illustrates a coil fabricated using current printed circuit technologies.
Figure 4:
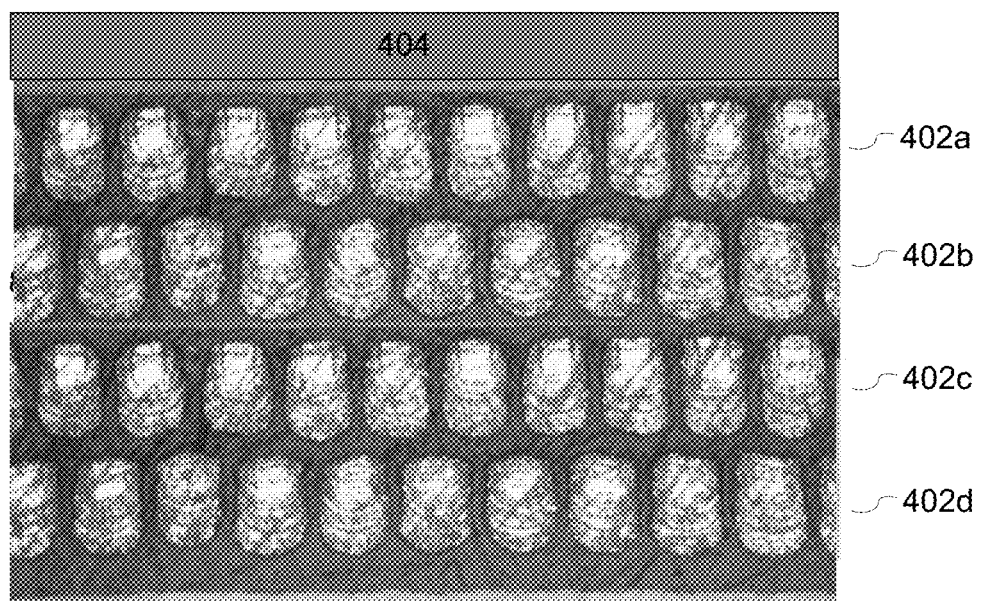
FIG. 4 illustrates a device including multiple layers of high-aspect ratio electroplated structures according to an embodiment configured for a linear motor type application.

FIG. 4 illustrates a device including multiple layers of high-aspect ratio electroplated structures according to an embodiment configured for a linear motor type application. Because of the dimension advantage over the current technologies, each layer 402a-d of high-aspect ratio electroplated structures is in closer proximity to a magnet 404 than is possible with current technologies, such as illustrated in FIG. 1. Further, the closer proximity of each layer 402a-d to the magnet 404 improves the force capability of the linear motor by taking advantage of the volume $\vec{B}$ field (magnetic flux density). Thus, the use of multilayer high-aspect ratio electroplated structures for a linear motor would require less layers than that using current technologies. Further, such a structure provides greater flexibility in obtaining electrical characteristics like low resistance.

Figure 5:
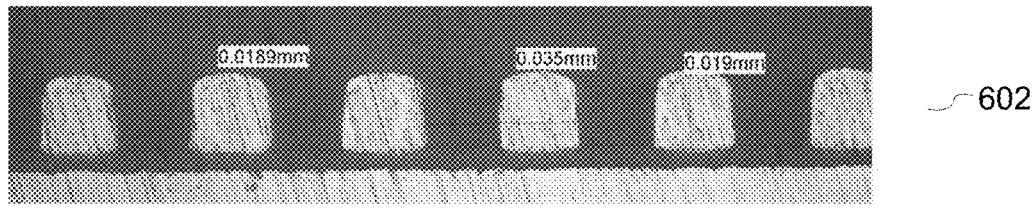
FIG. 5 illustrates high-aspect ratio electroplated structures according to some embodiments.

FIG. 5 illustrates high-aspect ratio electroplated structures, according to some embodiments, at a stage during the manufacturing process. The layer of high-aspect ratio electroplated structures 602 at this stage during the manufacturing process are formed using a semi-additive technology to create fine pitch, resist defined, conductors having an initial height to width aspect ratio (A/B) of approximately 1 to 1. For example, a high-aspect ratio electroplated structure may have a 20 micrometer height and a 20 micrometer width. According to some embodiments, the plating process is stopped at this point in order to remove the defining work, such as a photoresist mask, and seed layers using techniques including those known in the art.

Figure 6:
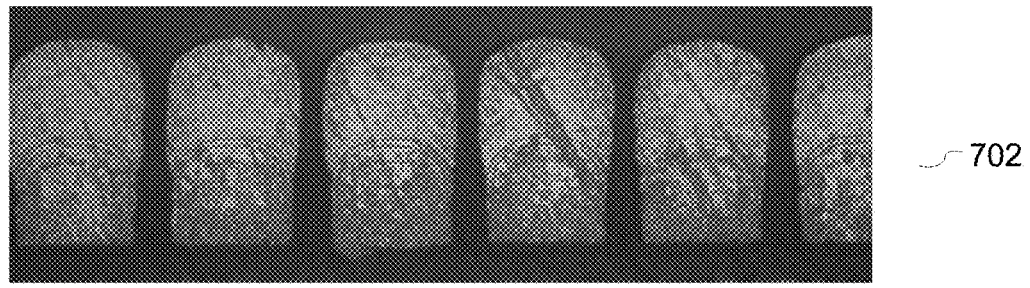
FIG. 6 illustrates the high-aspect ratio electroplated structures, according to some embodiments.

FIG. 6 illustrates the high-aspect ratio electroplated structures, according to some embodiments, at another stage during the manufacturing process. The layer of high-aspect ratio electroplated structures 702 at this stage during the manufacturing process are formed using crown plate technology to convert the semi-additive conductors to a high-aspect ratio, high percentage metal conductor circuit. For example the high-aspect ratio electroplated structures have a final height to width ratio (A/S) greater than 1 to 1. The final height to width ratio may be in a range including 1.2 to 3.0 according to various embodiments. Other embodiments include a final height to width ratio of greater than 3.0. However, one skilled in the art would understand that any final height to width ratio can be obtained to meet design and performance criteria using the techniques described herein. At the stage of formation as illustrated in FIG. 6 formed from the previous stage as illustrated in FIG. 5, there is no particular limit on the final height of the high-aspect ratio electroplated structures as disclosed in the various embodiments.

Figure 7:
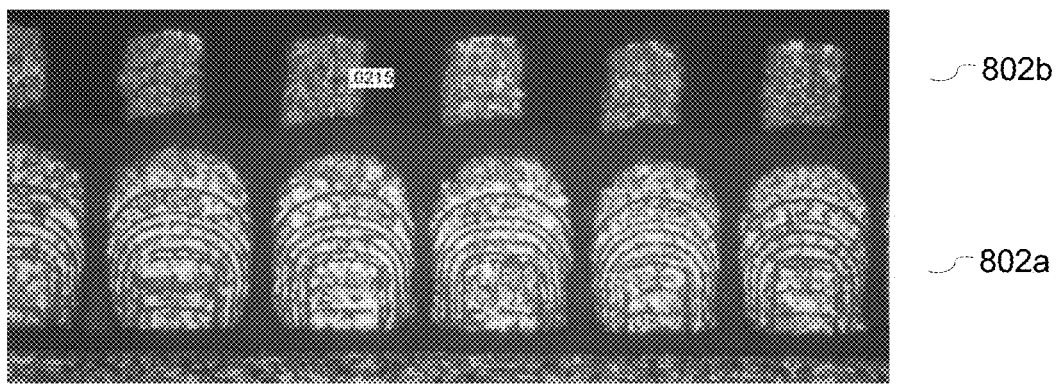
FIG. 7 illustrates the high-aspect ratio electroplated structures according to some embodiments.
Figure 8:
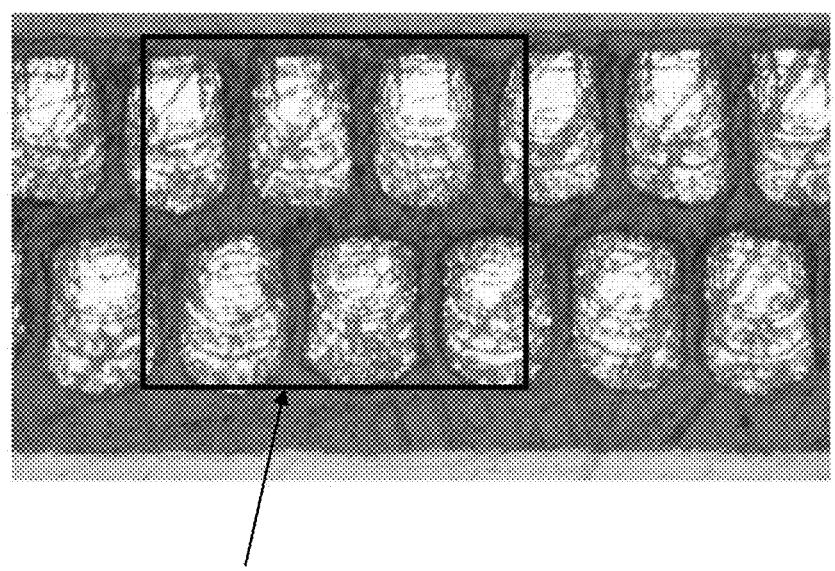
FIG. 8 illustrates a device having multiple layers of high-aspect ratio electroplated structures, according to some embodiments, with a high density cross-sectional area.

FIG. 7 illustrates the high-aspect ratio electroplated structures, according to some embodiments, at yet another stage during the manufacturing process. The layers of high-aspect ratio electroplated structures 802*a,b* at this stage during the manufacturing process are formed using planarization techniques to convert to allow multiple layers of high-aspect ratio electroplated structures to be stacked using semi-additive technology to form a subsequent layer. FIG. 8 illustrates a device having multiple layers of high-aspect ratio electroplated structures, according to some embodiments, with a high fraction of conductor cross-sectional area 901.

Figure 9:
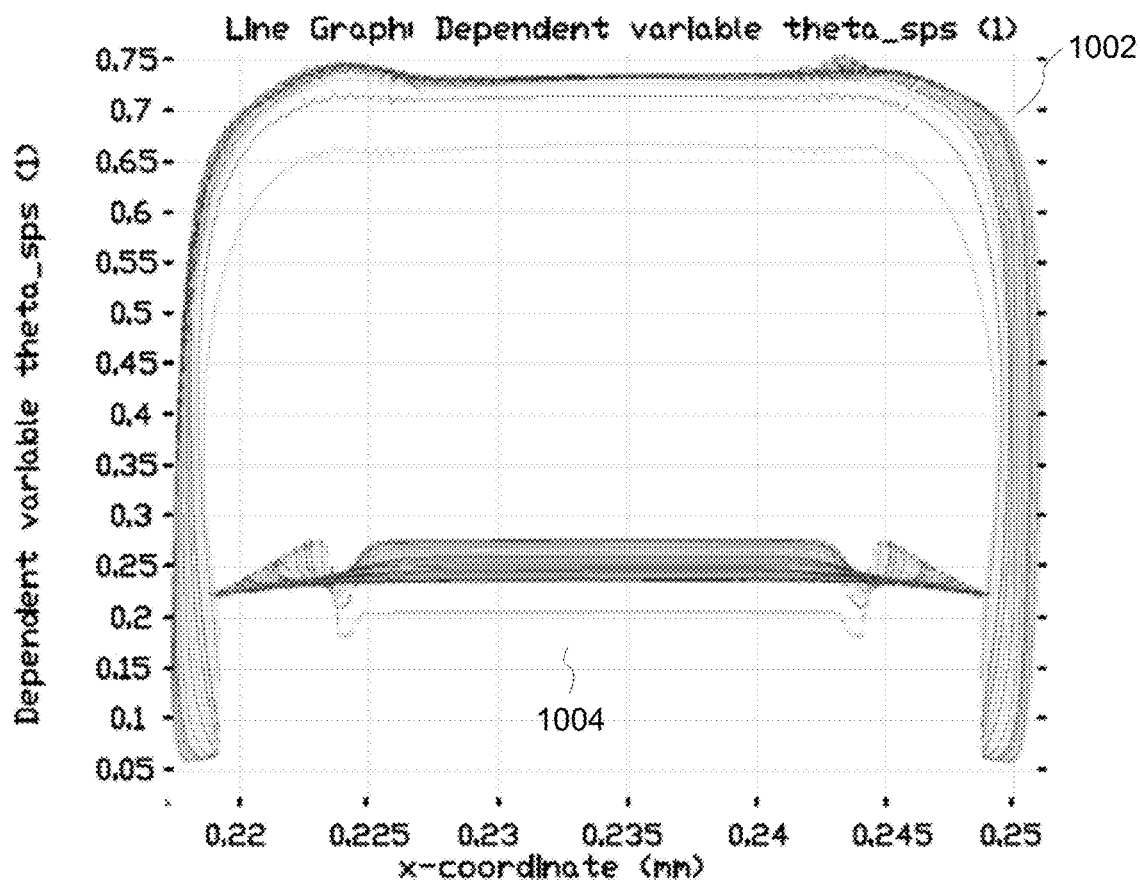
FIG. 9 illustrates a graph indicating the SPS coverage during a high current density plating technique and during a low current density plating technique according to embodiments.

Methods used to form the high-aspect ratio electroplated structures from structures, such as those illustrated in FIG. 5, include using a low current density plating technique. This plating technique plates the side walls until the desired space is obtained between the high-aspect ratio electroplated structures. For various embodiments if the space between the high-aspect ratio electroplated structures is not narrowed enough, then unwanted pinching at the top can occur. Pinching occurs where the top edges of adjacent structures grow together and pinch off the gaps, which results in a short circuit. For various embodiments, the low current density plating process is enhanced by sufficient fluid exchange, such that a fresh plating bath is continuously made available to the surfaces where copper plating is occurring. Further, the methods used to form the high-aspect ratio electroplated structures include using a high current density plating technique. This high current density plating technique runs at a high percentage of the mass transfer limit. This plates primarily or solely onto the top of the conductive materials that form the high-aspect ratio electroplated structures. The high current density plating process is enhanced by precise current density control. FIG. 9 illustrates a graph with upper lines 1002 that indicate the high SPS coverage during the high current density plating technique according to an embodiment and with lower lines 1004 that indicate the low, very uniform, accelerator coverage during a low current density plating technique according to an embodiment.

Figure 10A:
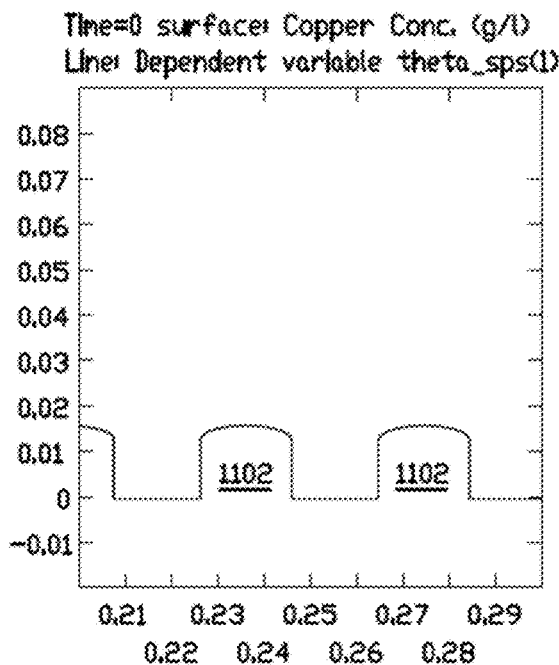
FIGS. 10a-f illustrate a process for forming high-aspect ratio electroplated structures according to an embodiment.
Figure 10B:
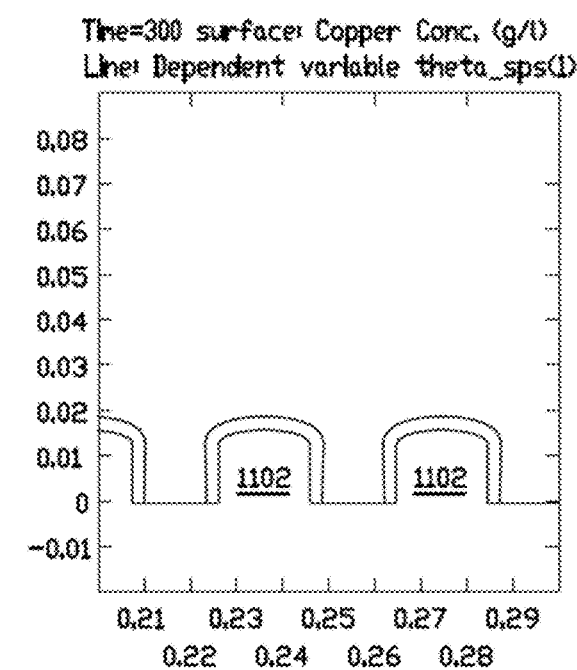

FIGS. 10*a-f* illustrate a process for forming high-aspect ratio electroplated structures according to an embodiment. FIG. 10*a* illustrates traces 1102 formed at a thick limit of resist capability at a time T1 of the process. For some embodiments, the pre-plated traditional traces are formed of copper using a process, such as a damascene process, or using etching and deposit techniques including those known in the art. FIG. 10*b* illustrates the formation of the high-aspect ratio electroplated structures at a time T2 during a low current density or conformal plating process. A conformal plating process, according to an embodiment, grows all surfaces of the traces at approximately the same rate. Further, the conformal plating process suppresses plating kinetic (low accelerator coverage). The conformal plating process also provides a fairly uniform metal concentration that has high, uniform suppressor coverage to compensate. This suppressed plating kinetic effect can be enhanced by inclusion of a leveler to the plating bath. Obtaining a uniform metal concentration and obtaining high, uniform suppressor coverage require lower current densities. According to some embodiments, a conformal plating process that uses 2 amps per square decimeter is used for the plating, such as copper, the brightener additive, the temperature and fluid mechanics of the platers. An example of such a conformal plating process includes, but is not limited to, a low current density plate process. At low current densities, the plating bath maintains a uniformly suppressed state providing conformal plating. For another embodiment, the addition of a leveler can be used in the plating bath to provide for a higher current density and faster plating. For yet another embodiment, increasing the copper content to near the solubility limit of copper sulfate in the plating bath can be used to further increase in the current density. This provides the ability to double the current density or even greater to achieve the same conformal plating quality. For example, the copper content may be as high as 40 grams per Liter with reduced acid content to prevent common ion effects.

Figure 10C:
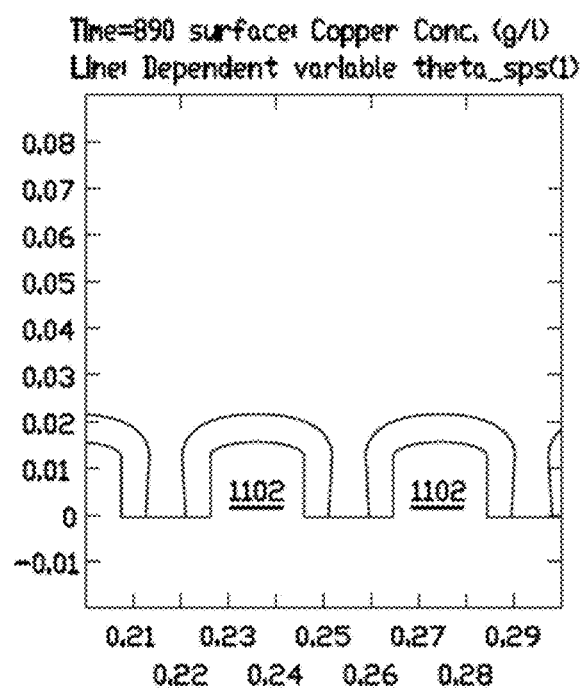

For some embodiments, the low current density plate process deposits a conductive material, such as copper, onto the top and sidewalls of the traces 1102, for example T2 is approximately five minutes into the process during the low current density plate process (T1+5 minutes). FIG. 10*c* illustrates the formation of the high-aspect ratio electroplated structures at a time T3 into the process during the low current density plate process. For an embodiment, the low current density plate process deposits a conductive material, such as copper, onto the top and sidewalls of the traces 1102, for example T3 is approximately five minutes into the process during the low current density plate process (T1+15 minutes).

Figure 10D:
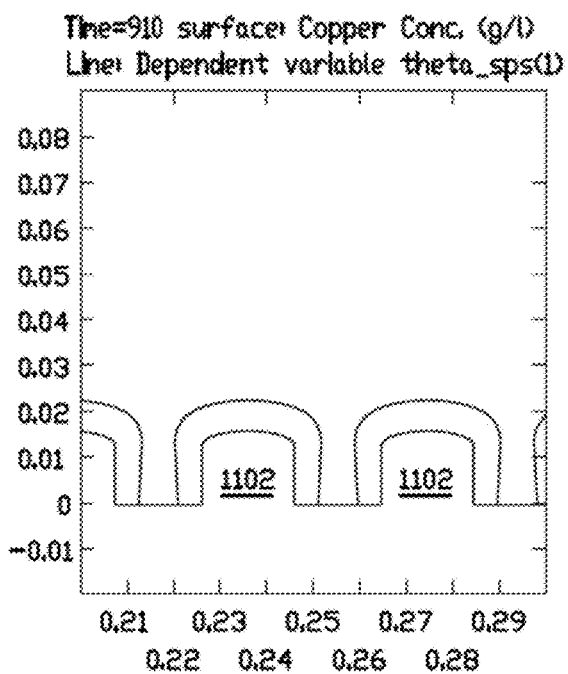

FIG. 10*d* illustrates the formation of the high-aspect ratio electroplated structures at a time T4 into the process during crown plating process, such as a high current anisotropic super-plating process. For example T4 is approximately 15 minutes and 10 seconds into process (T1+15 minutes 10 seconds). For some embodiments, the high current anisotropic super-plating process is a crown plate. A crown plate is based on balancing the interactions between the following factors: metal concentration in the solution; brightener additive; suppressor additives; mass transfer—fluid exchange rate to surface; leveler; and current density at substrate. The metal concentration in the solution may include, but is not limited to, copper. The brightener additive may include, but are not limited to, SPS (bis(3-sulfopropyl)-disulfide), DPS (3-N,N-dimethylaminodithiocarbamoyl-1-propanesulfonic acid), and MPS (mercaptopropylsulfonic acid). The suppressor additive may include, but is not limited to, straight PEG of various molecular weights including those known to those skilled in the art, poloxamines, co-block polymer of poly-ethylene and polypropylene glycols such as water soluble poloxamers known by various trade names such as BASF pluronic f127, and random co-polymers such as the DOW® UCON family of high performance fluids, again at various ratios of the monomers and various molecular weights, Polyvinylpyrolidones of various molecular weights.

The high current anisotropic super-plating process, according to some embodiments, includes a suppressed exchange current that is 1% of accelerated current. Further, the side walls of the high-aspect ratio electroplated structures being formed have a nearly zero accelerator coverage. The nearly zero accelerator coverage is achieved by shifting the Nernst Potential for copper deposition to favor suppressor coverage. Moreover, high over potential and copper availability (transport phenomena) leads to high accelerator coverage at the top of the structure being formed. The copper bulk concentrate also may be tuned to support the nearly zero accelerator coverage during the process. For example, the copper bulk concentrate for the high current anisotropic super-plating process is 14 grams per Liter or less. For some embodiments, the copper bulk concentrate depends on the specific fluid mechanics. Because various embodiments of the process run at a high fraction of the mass-transfer-limit, small differences in fluid velocity across the article to be plated will impact what the mass-transfer-limit is, achieving a sufficient control of the gap between plated lines without a high degree of control of the fluid velocity across all areas of the article to be plated is difficult. The high current anisotropic super-plating process, according to some embodiments, includes a leveler additive to defeat accelerator coverage to minimize or eliminate plating on the side walls of the structure being formed. For other embodiments, a plating bath is used without a leveler additive.

At elevated current densities, such as those used during the high current anisotropic super-plating process, a three-fold feedback mechanism comes into play according to some embodiments. The mass-transfer effects deplete copper in the space between the traces. Moreover, the high current densities support an accelerator (e.g., SPS) dominated surface. To maintain suppressed side walls, mass transfer is tuned to lower the Nernst potential through copper mass transfer effects. For example, the fluid boundary layer thickness and spacing between each trace is designed to lower the Nernst potential.

Further, high current anisotropic super-plating process, according to some embodiments, includes operating at a copper concentration where these differences can create a greater than four times concentration difference. During such conditions, the lower copper concentration and Nernst potential contributes to a decrease in plating rate. For example, when the Nernst potential is shifted approximately in a range of 50 millivolts ("mV") to 60 mV this can contribute to a twenty times decrease in the plating rate. Such conditions induce Tafel kinetics, which for copper plating is a ten times change in current for every 120 mV change in applied voltage, not rectifier voltage. Lower sidewall current feeds back to the top surface of the structures being formed where diffusion length is short, which promotes faster delivery of metal from the plating bath (solution) to the surface and higher accelerator coverage instead of suppression, and high Nernst potential. For some embodiments, a two additive system (e.g., brightener and suppressor) is used. Leveler diminishes the feed-back mechanism by blocking the SPS action on the top side of the plated feature.

As the spacing between metal conductors or traces continue to shrink, the aspect ratio of the height to width of the space between the metal conductors increase substantially. According to some embodiments, methods of electroplating processes provided herein achieve plating in the spacing between metal conductors at aspect ratios of 7:1 and greater.

Methods of forming high-aspect ratio electroplated structures, according to some embodiments, provide selective formation of metal crown plating at selective locations or regions. In one exemplary embodiment, selective formation of a metal crown is achieved by carrying out the electroplating process according the relationship:

$$\frac{C}{C\infty} \leq 0.33$$

where C is the concentration of the metal (in this instance copper) where the plating takes place, and $C\infty$ is the bulk concentration in the plating bath. This relationship can also be expressed as carrying out the electroplating process where $$\frac{C}{C\infty}$$

is equal to or greater than 67 percent (%) of the mass transfer limit. According to other embodiments, selective formation of a metal crown is achieved by carrying out the electroplating process according to the relationship:

$$\frac{C}{C\infty} \leq 0.2$$

or where $$\frac{C}{C\infty}$$

is equal to or greater than 80% of the mass transfer limit. In another aspect, selective formation of a metal crown is achieved by carrying out the electroplating process according the relationship:

$$\frac{i}{i \, \text{limit}} \geq 0.8$$

here i is the current density and $i_{limit}$ is current density limit.

Figure 10E:
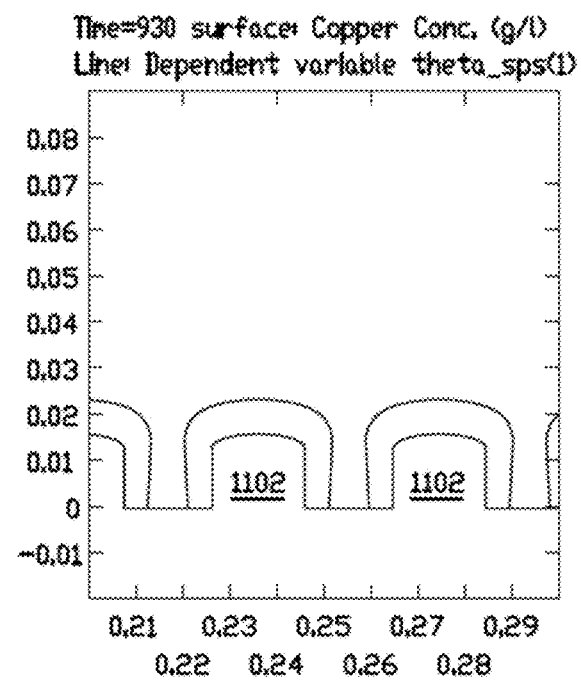
Figure 10F:
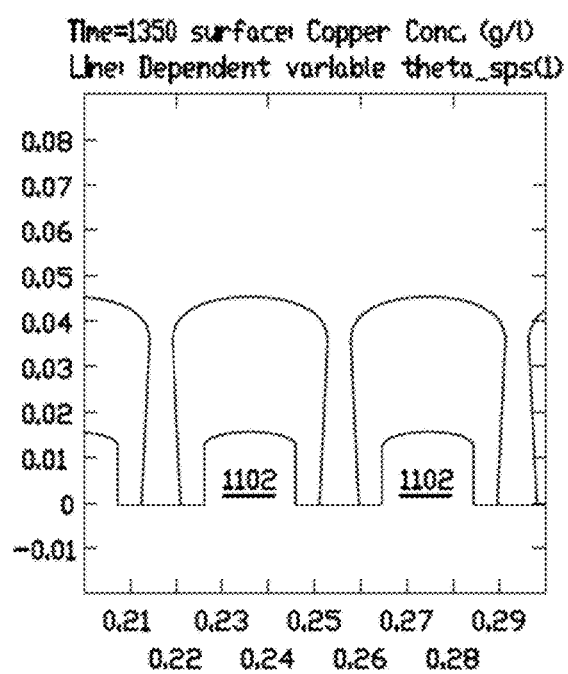

FIG. 10e illustrates the formation of the high-aspect ratio electroplated structures at a time T5 during a high current anisotropic super-plating process. For example, T5 is approximately 15 minutes and 30 seconds into process (T1+15 minutes 30 seconds). For another embodiment, the formation of the high-aspect ratio electroplated structures as illustrated in FIG. 10e occurs at a time T5=T1+5 minutes. FIG. 10f illustrates the formation of the high-aspect ratio electroplated structures at a time T6 during a high current anisotropic super-plating process. This illustrates the end of the crown plating process, which finalizes the formation of the high-aspect ratio electroplated structures according to some embodiments. For example, T6 is approximately 20 minutes into the process (T1+20 minutes). For another embodiment, the formation of the high-aspect ratio electroplated structures as illustrated in FIG. 10f occurs at a time T6=T1+10 minutes.

For some embodiments, the methods for forming high-aspect ratio electroplated structures use processes including conformal plating and anisotropic plating as described herein. The conformal plating process uses 2/3 of the total plating time according to some embodiments. For other embodiments, the conformal plating process uses ⅓ of the total plating time. Further, the conformal plating process starts at 2 amps per square decimeter ("ASD") for a low metal plating bath or 4 ASD for a high metal plating bath. For example, the plating bath includes 12 grams per Liter of copper and 1.85 molar (mole per Liter) of sulfuric acid. Alternatively, the conformal plating process is a process that plates at a rate of 0.4 to 1.2 micrometers per minute. The conformal plating process, according to an embodiment, continues until the space between the traces is in a range including 6-8 micrometers. The current density will slowly decrease as the surface area of the structures being formed increases. However, the process will achieve a uniform current density and growth rate of all the surfaces being formed. For some embodiments the current can be increased to maintain current density as the surface area of the high-aspect ratio structures being formed increases.

The anisotropic plating process, according to some embodiments, uses ⅓ of the total plating time to form the high-aspect ratio electroplated structures. The anisotropic plating process increases the ASD to 7 ASD (3.5 times the current of the conformal plating process) but, on average, double that at the top of the metal structure being formed. The same fluid flow can be maintained as used in the conformal plating process. For example, the plating rate is 3 micrometers per minute the top of the structure being formed with nearly zero plating rate on the side walls of the structure. As the structure grows, the average current drops in half, but peak current density is maintained at around 14 ASD at the top of the structured according to embodiments. For example, a peak current density is just over 50% of the mass-transfer-limit at the top surface and even though the side walls are exposed to approximately 3 grams per Liter of copper, the side walls plate at less than 10% of the mass-transfer limit or a 5:1 plating rate. At higher fractions of the mass transfer limit, one can get higher plating rate ratios.

Embodiments of the methods for forming high-aspect ratio electroplated structures include variations to those described above to form high-aspect ratio electroplated structures including different characteristics. For example, the copper content in a plating bath configured as an anisotropic bath can be different than the 13.5 grams per Liter as described above. Altering the copper content in a flat trace bath while using the same current density can be used to control the spacing between the high-aspect ratio electroplated structures. Another embodiment of the method described herein includes using a flat trace bath having a flat trace bath with a copper content of 12 grams per Liter to form high-aspect ratio electroplated structures spaced 8 micrometers apart. Yet another embodiment of the method described herein includes using a flat trace bath having a flat trace bath with a 15 grams per Liter to form high-aspect ratio electroplated structures spaced 4 micrometers apart. Thus, one skilled in the art would understand that adjusting other parameters of the methods described herein can be used to alter the characteristics of the high-aspect ratio electroplated structures. Some embodiments of the methods described herein include adjusting current density to match current plater conditions, such as mass-transfer rate, metal contained in the plating bath, fluid velocity, copper concentration, additives used, and temperature.

The method to form high-aspect ratio electroplated structures also includes using a thin dielectric process. According to some embodiments, photosensitive polyimide is used as the dielectric between each high-aspect ratio electroplated structure. The liquid photosensitive polyimide enables small via capability, good coverage between the high-aspect ratio conductors, good registration/margin capability, is a high reliability material, and has a coefficient of thermal expansion ("CTE") that is a close match to copper. The liquid photosensitive polyimide can easily fill the gap between the high-aspect ratio electroplated structures. According to some embodiments, the use of liquid photosensitive polyimide is used to create via access down to 0.030 millimeters. Other dielectrics that could be used include, but are not limited to, KMPR and SU-8.

Figure 11:
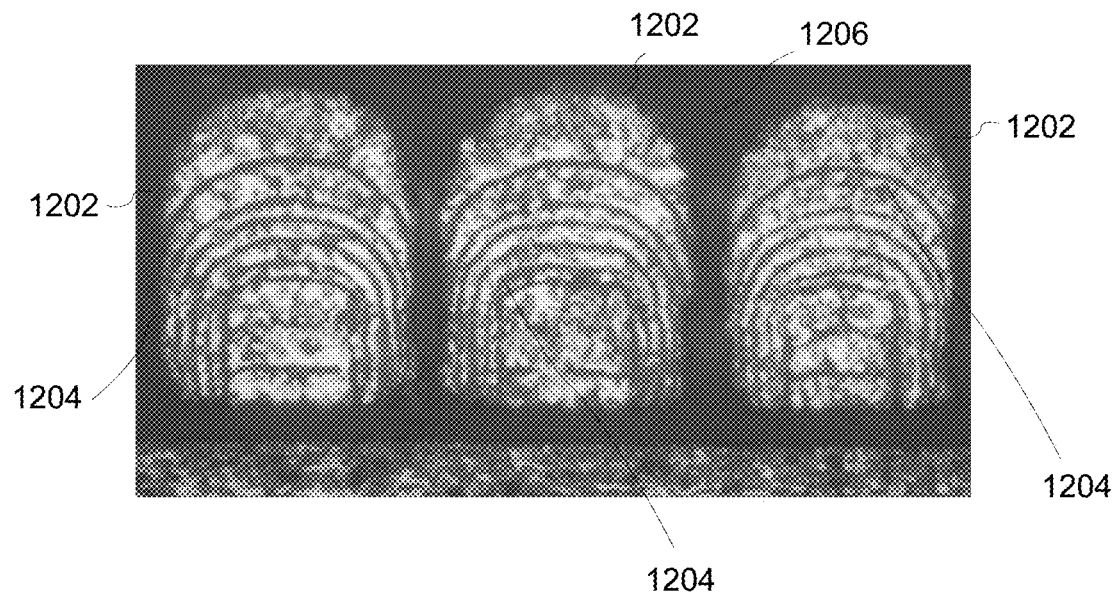
FIG. 11 illustrates high-aspect ratio electroplated structures according to some embodiments.
Figure 12:
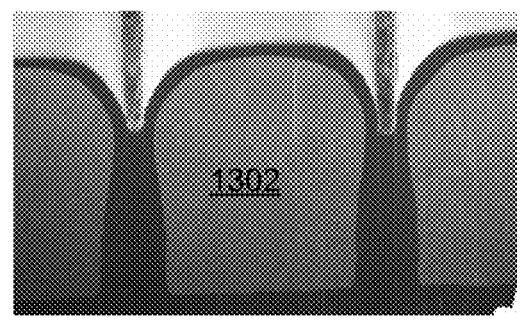
FIG. 12 illustrates a perspective view of high-aspect ratio electroplated structures according to some embodiments.

FIG. 11 illustrates high-aspect ratio electroplated structures, according to some embodiments, formed using methods described herein. Each high-aspect ratio electroplated structure 1202 includes multiple grain lines 1204 that show how the electroplating process progresses to form the structures. The thin dielectric 1206 is formed in between the high-aspect ratio electroplated structures 1202 and disposed on the high-aspect ratio electroplated structures 1202. FIG. 12 illustrates a perspective view of high-aspect ratio electroplated structures 1302, according to some embodiments, formed using methods described herein.

Figure 13A:
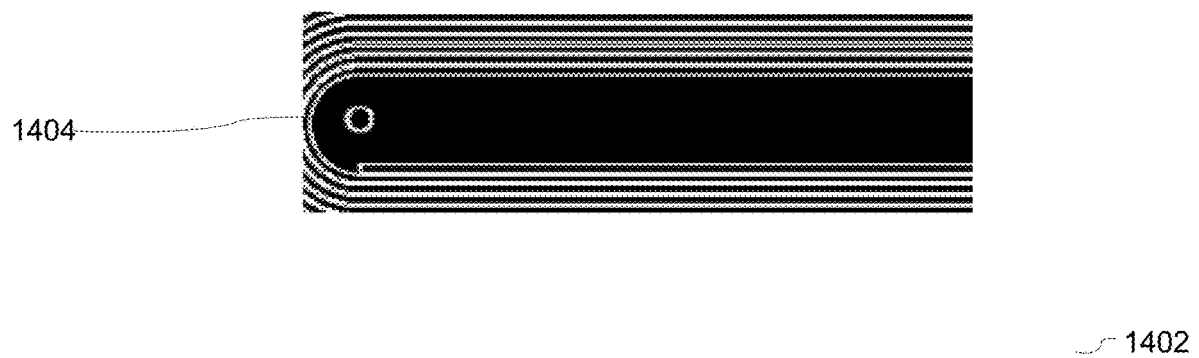
FIGS. 13a,b illustrate a high density precision coil formed using high-aspect ratio electroplated structures according to an embodiment.
Figure 13B:
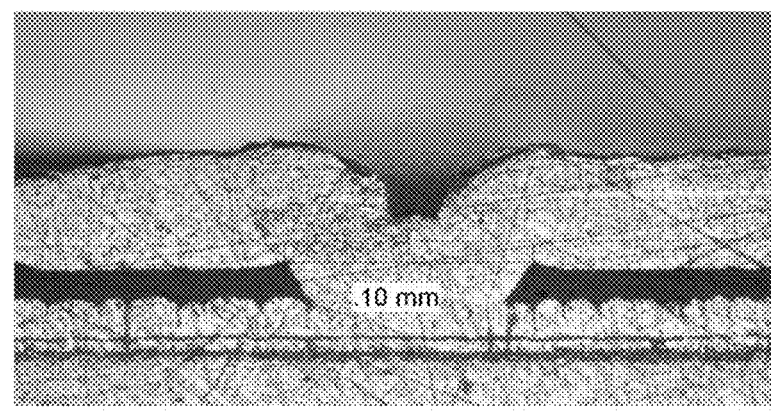

The methods described herein can be used to form high-aspect ratio electroplated structures that form high density precision coils. FIG. 13a illustrates a high density precision coil formed using high-aspect ratio electroplated structures according to an embodiment. The coil 1402 is formed of high-aspect ratio electroplated structures such as those described herein. The high density precision coil also includes a center coil via 1404. The center coil via 1404 reduces the voltage drop across the coil during the manufacture steps described herein. Further, the center coil via 1404 enables the ability to better control the variability of the pitch within a coil through better control of the voltage drop and the current during the anisotropic plating process described herein. The center coil via 1404 also enables better control of the voltage drop of the formed high density precision coil. FIG. 13b illustrates a cross-section of a center coil via 1404 as part of a high density precision coil as described herein.

Figure 14:
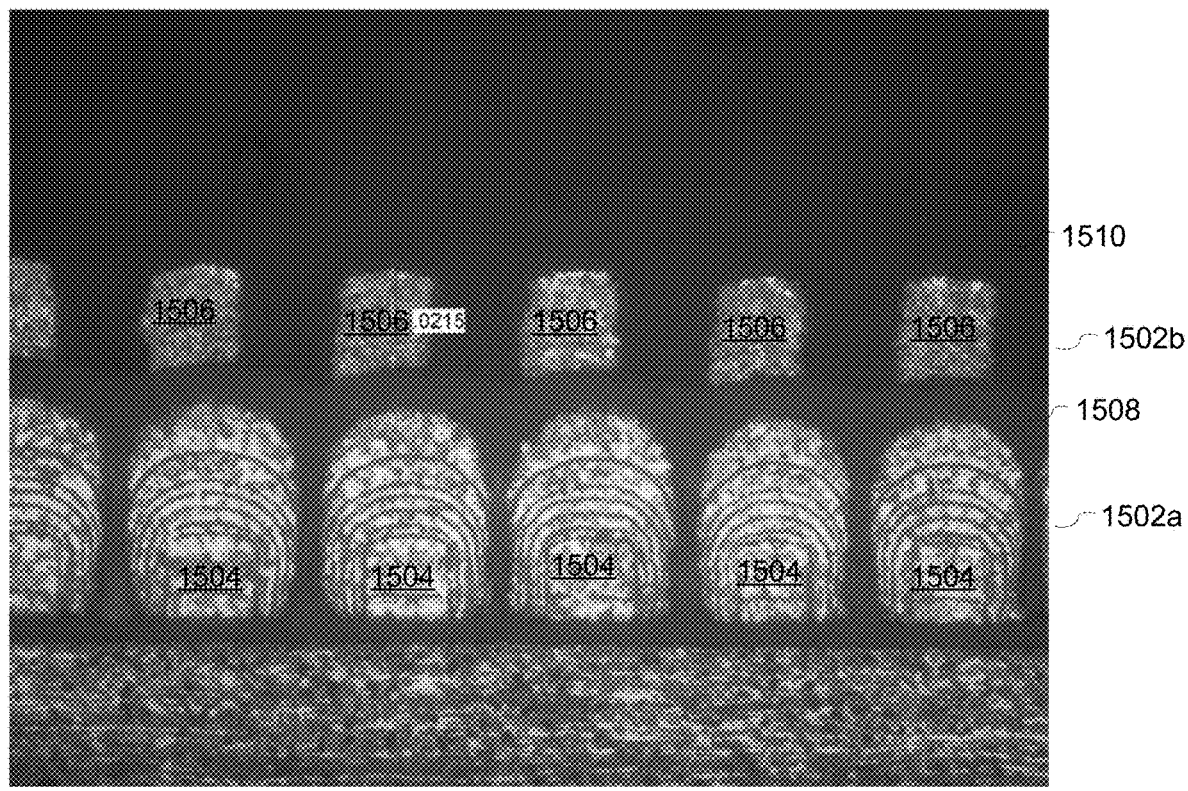
FIG. 14 illustrates the high-aspect ratio electroplated structures including high resolution stacked conductor layers according to an embodiment.

FIG. 14 illustrates the high-aspect ratio electroplated structures including high resolution stacked conductor layers according to an embodiment. The first conductor layer 1502a includes high-aspect ratio electroplated structures 1504 formed using techniques including those described herein. A first dielectric layer 1508 is formed using a thin dielectric process using techniques including those described herein. The first dielectric layer 1508 fills all the spaces between the high-aspect ratio electroplated structures of the first conductor layer 1502a and forms a coating over the high-aspect ratio electroplated structures 1504. The first dielectric layer 1508 is planarized using techniques know in the art. The second conductor layer 1502b includes high-aspect ratio electroplated structures 1506 formed over the planarized surfaced of the first dielectric layer 1508. A second dielectric layer 1510 is formed using a thin dielectric process using techniques including those described herein to fill all the spaces between the high-aspect ratio electroplated structures 1506 of the second conductor layer 1502b and to form a coating over the high-aspect ratio electroplated structures 1506. The second dielectric layer 1510 can also be planarized. Additional layers including high-aspect ratio electroplated structures can be formed using the techniques described herein.

Figure 15:
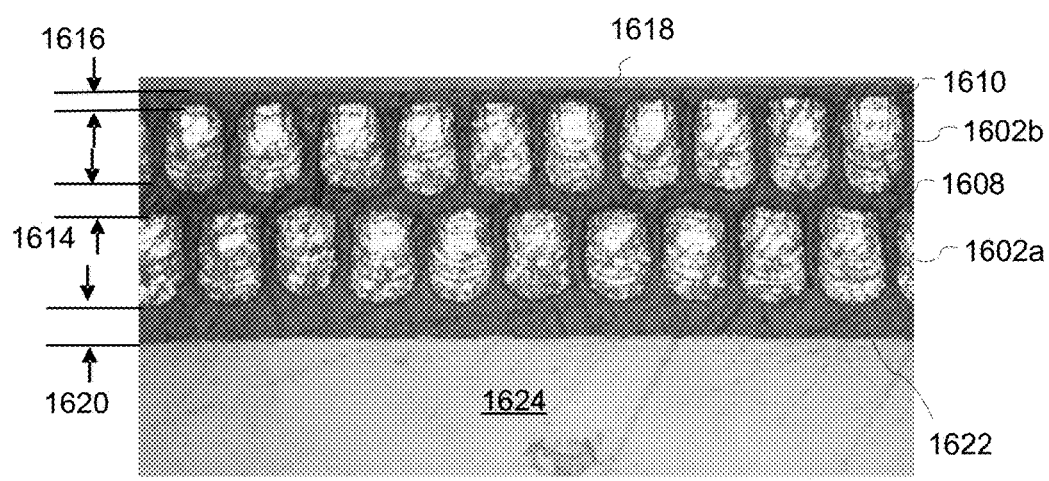
FIG. 15 illustrates a high-density precision coil including high-aspect ratio electroplated structures according to an embodiment.

FIG. 15 illustrates a high-density precision coil including high-aspect ratio electroplated structures according to an embodiment including high resolution stacked conductor layers. The first conductor layer 1602a includes high-aspect ratio electroplated structures formed using techniques including those described herein. A first dielectric layer 1608 is formed using a thin dielectric process using techniques including those described herein. The first dielectric layer 1608 fills all the spaces between the high-aspect ratio electroplated structures of the first conductor layer 1602a and forms a coating over the high-aspect ratio electroplated structures. The first dielectric layer 1608 is planarized using techniques know in the art. The second conductor layer 1602b includes high-aspect ratio electroplated structures formed over the planarized surfaced of the first dielectric layer 1608. A second dielectric layer 1610 is formed using a thin dielectric process using techniques including those described herein to fill all the spaces between the high-aspect ratio electroplated structures of the second conductor layer 1602b and to form a coating over the high-aspect ratio electroplated structures. The second dielectric layer 1610 can also be planarized. Additional layers including high-aspect ratio electroplated structures can be formed using the techniques described herein.

The high-density precision coil is formed to have a first distance 1614 between a high-aspect ratio electroplated structure of the first conductor layer 1602a and a high-aspect ratio electroplated structure of the second conductor layer 1602b. For various embodiments, the first distance 1614 is less than 0.020 millimeters. For another embodiment, the first distance 1614 is 0.010 millimeters. The high-density precision coil is formed to have a second distance 1616 between a surface 1618 of the second dielectric layer 1610 and a high-aspect ratio electroplated structure of the first conductor layer 1602a. For various embodiments, the second distance 1616 is less than 0.010 millimeters. For some embodiments, the second distance 1616 is 0.005 millimeters. For some embodiments, the second distance 1616 can be the starting gap minus the final desired gap divided by 2. The high-density precision coil is formed to have a third distance 1620 between a high-aspect ratio electroplated structure of the first conductor layer 1602a and a surface of the first dielectric layer 1622. For various embodiments, the third distance 1620 is less than 0.020 millimeters. For some embodiments, the third distance 1620 is less than 0.015 millimeters. For another embodiment, the third distance 1620 is 0.010 millimeters. For various embodiments, the first dielectric layer is formed on a substrate 1624 using techniques including those described herein. For some embodiments the substrate 1624 is a stainless steel layer. One skilled in the art would understand that the substrate 1624 can be formed other materials including, but not limited to, steel alloys, copper alloys such as bronze, pure copper, nickel alloys, beryllium copper alloys and other metals including those known in the art.

Other advantages of forming devices using the high-aspect ratio electroplated structures as described herein include devices with high structural strength, high reliability, and high heat dissipation capacity. The high structural strength is provided through the ability to form very dense concentration of metal high-aspect ratio electroplated structures on all layers of a device. Further, processes for forming the metal high-aspect ratio electroplated structures described herein provide cross directional alignment of the structures from layer to layer adding to the high structural strength. High structural strength of the devices formed using processes for forming the metal high-aspect ratio electroplated structures described herein is also as a result of good adhesion of the dielectric layer material, such as the photosensitive polyimide layers, to the structures. For some embodiments, the high-aspect ratio electroplated structures formed using techniques described herein are coated with a non-magnetic nickel layer to increase adhesion of the dielectric layer. This would further increase the high structural strength of the final device formed using the high-aspect ratio electroplated structures described herein.

The reliability of the devices formed using the high-aspect ratio electroplated structures described herein is also high because of the use of high reliability materials, such as photosensitive polyimide for the dielectric layers, which provides robust electrical performance. Using the techniques described herein, provide the capability to form devices with less dielectric material and reduce the overall thickness of the formed device. Thus, the heat dissipation is increased through increased thermal conductivity over devices using current process technologies.

Figure 16A:
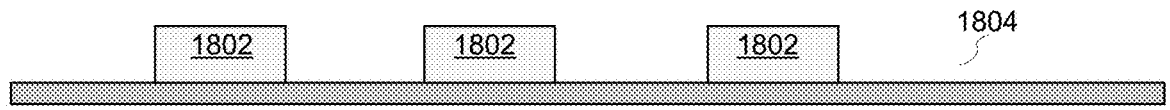
FIG. 16a-c illustrate a process for forming high-aspect ratio electroplated structures according to another embodiment.
Figure 16B:
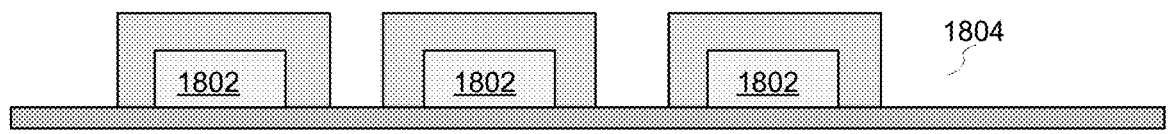
Figure 16C:
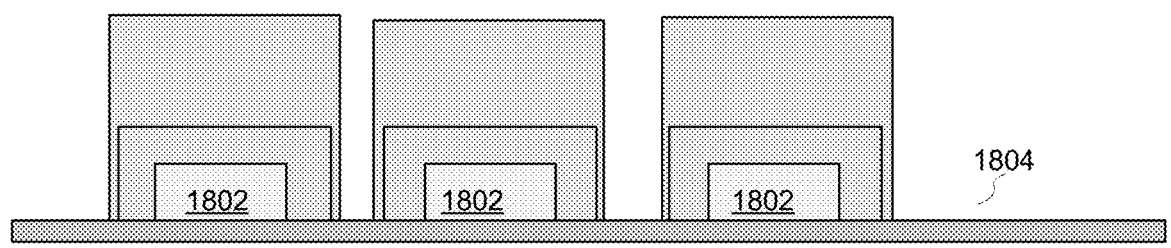

FIGS. 16a-c illustrate a process for forming high-aspect ratio electroplated structures according to another embodiment. FIG. 16a illustrates traces 1802 formed on a substrate 1804 using a subtractive etch. According to some embodiments, a metal layer formed over substrate 1804. A photoresist layer is formed over a metal layer using techniques including those known in the art. For some embodiments, the photoresist layer is a photosensitive polyimide deposited over the metal layer in a liquid form. The photoresist is pattered and developed using techniques including those known in the art. The metal layer is then etched using techniques including those known in the art. After the etching process, the traces 1802 are formed.

FIG. 16b illustrates the formation of the high-aspect ratio electroplated structures using a conformal plating process, such as those described herein. FIG. 16c illustrates the formation of the high-aspect ratio electroplated structures using a crown plating process, such as those described herein. For various embodiments, the high-aspect ratio electroplated structures are formed without using the conformal plating process, such as that described with reference to FIG. 16b. Instead, a crown plating process, such as that described with reference to FIG. 16c, is used after the formation of traces 1802 as illustrated in FIG. 16a.

Figure 17:
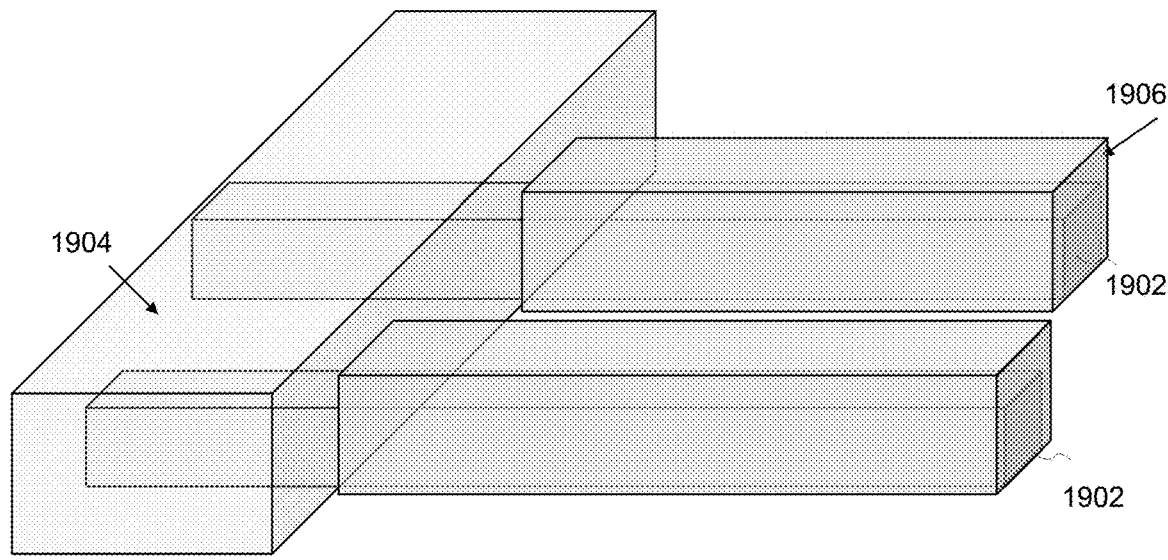
FIG. 17 illustrates a selective formation of high-aspect ratio electroplated structures according to an embodiment.
Figure 18:
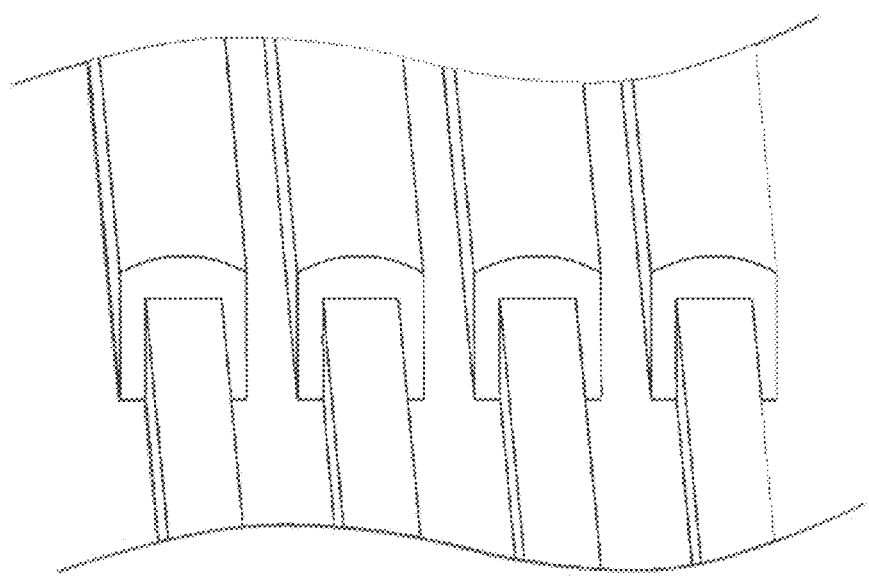
FIG. 18 illustrates a perspective view of high-aspect ratio electroplated structures according to an embodiment formed with the metal crown portion formed selectively on traces.

FIG. 17 illustrates a selective formation of high-aspect ratio electroplated structures according to an embodiment. Once traces 1902 are formed using techniques including those described herein, a photoresist layer 1904 is formed over a section of one or more of the formed traces 1902. The photoresist layer 1904 can be a photosensitive polyimide and deposited and formed using techniques including those described herein. The metal crown 1906 is formed on the traces 1902 using one or both of a conformal plating process and a crown plating process as described herein. FIG. 18 illustrates a perspective view of high-aspect ratio electroplated structures according to an embodiment formed with the metal crown portion formed selectively on traces. Selective formation of a metal crown portion on traces, according to some embodiments, is used to improve structural properties of the high-aspect ratio electroplated structures, improve electrical performance of the high-aspect ratio electroplated structures, improve heat transfer properties, and to meet custom dimensional requirements for devices formed using the high-aspect ratio electroplated structures. Examples of electrical performance improvements include, but are not limited to, capacitance, inductance, and resistance properties of a high-aspect ratio electroplated structure. Further, the selective formation of a metal crown portion on a trace can be used to tune mechanical or electrical properties of a circuit formed using high-aspect ratio electroplated structures.

Figure 19:
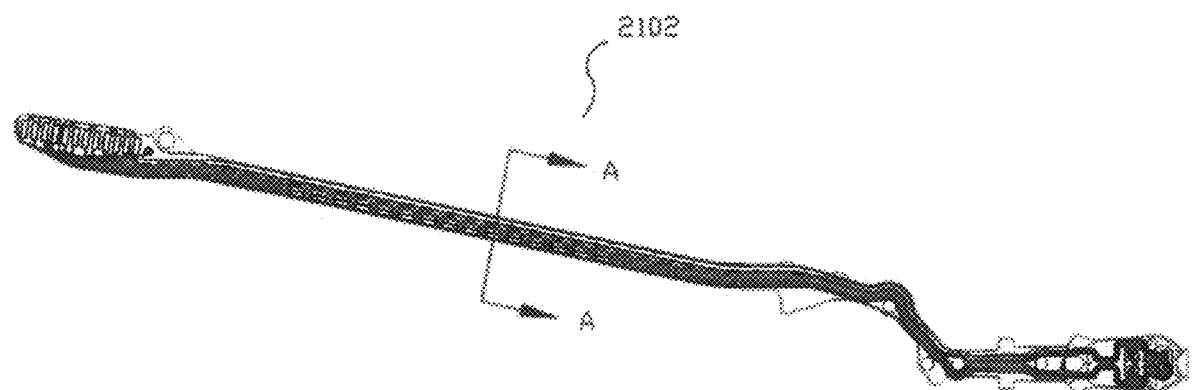
FIG. 19 illustrates a hard drive disk suspension flexure that includes high-aspect ratio electroplated structures according to an embodiment.
Figure 20:
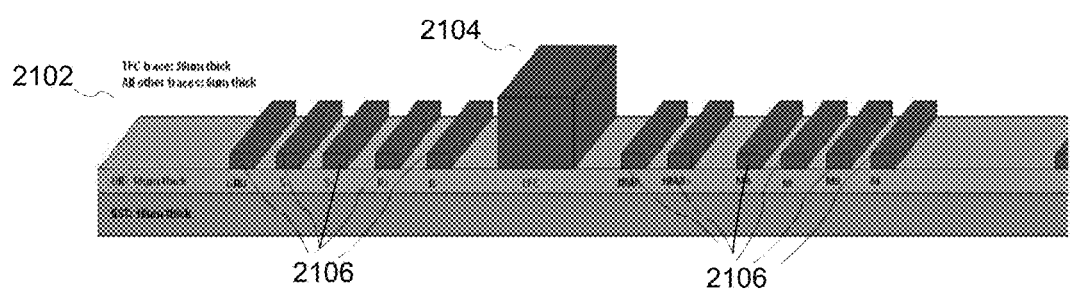
FIG. 20 illustrates a cross sectional view of the hard disk drive suspension flexure illustrated in FIG. 19.

FIG. 19 illustrates a hard drive disk suspension flexure 2102 that includes high-aspect ratio electroplated structures, according to an embodiment, formed using selective formation as described herein. FIG. 20 illustrates a cross sectional view of the hard disk drive suspension flexure illustrated in FIG. 19, taken along line A-A. The cross section of the flexure 2102 includes a high-aspect ratio electroplated structure 2104 and traces 2106. The high-aspect ratio electroplated structure 2104 formed using a selective formation technique as described herein. Forming a high-aspect ratio electroplated structure 2104 to use as a conductor in predetermined regions of a flexure can achieve a reduction in DC resistance. This allows fine lines and spaces where needed on the flexure while meeting design requirements for DC resistance and improve electrical performance of a flexure.

FIGS. 21a,b illustrate a process for forming high-aspect ratio electroplated structures according to an embodiment using photoresist during a conformal plating process. FIG. 21a illustrates traces 2302 formed on a substrate 2304 using techniques including those described herein. FIG. 21b illustrates the forming of the high-aspect ratio electroplated structures using a plating process as described herein. Photoresist portions 2306 are formed over the substrate 2304 using deposition and patterning techniques including those described herein. Once the photoresist portions 2306 are formed one or both of a conformal plating process and a crown plating process is performed to form the metal portion 2308 on the traces 2302. The photoresist portions 2306 can be used to better define spacing between the high-aspect ratio electroplated structures.

FIG. 22 illustrates exemplary chemistries used for a process to form the initial metal layer, a standard/conformal plating process, and a crown plating process according to various embodiments.

Figure 23:
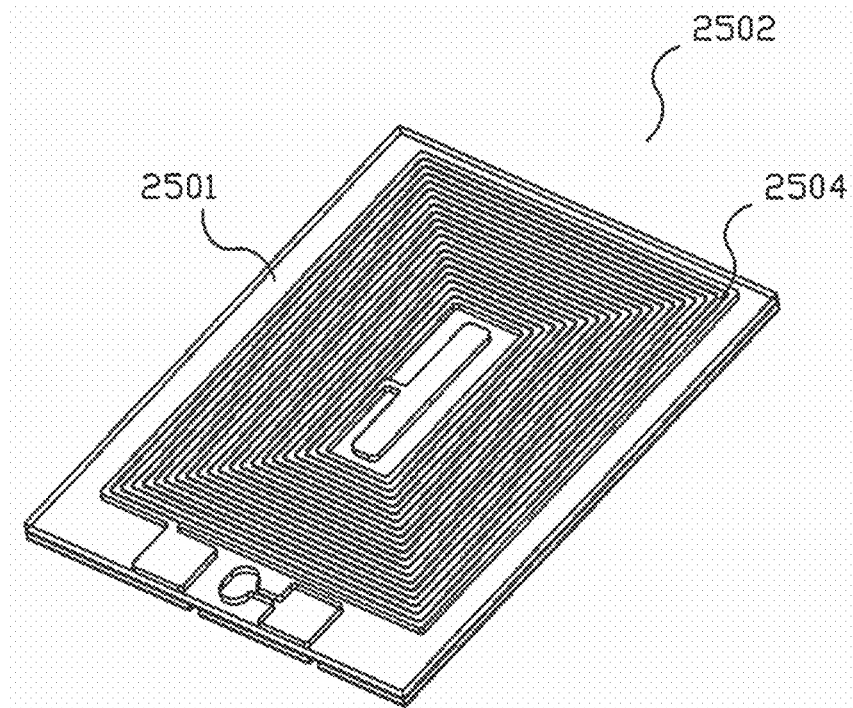
FIG. 23 illustrates a perspective view of a top surface of an inductive coupling coil formed from high-aspect ratio electroplated structures according to an embodiment.

FIG. 23 illustrates a perspective view of a top surface 2501 of an inductive coupling coil 2502 formed from high-aspect ratio electroplated structures 2504 according to an embodiment with an integrated tuning capacitor. The use of high-aspect ratio electroplated structures to form the inductive coupling coil reduces the footprint of the inductive coupling coil compared with inductive coupling coils using current technologies to form the coil. This enables the inductive coupling coil 2502 to be used in applications that where space is limited. Further, the use of a capacitor integrated into the inductive coupling coil further reduces the footprint of the inductive coupling coil because extra space requirements are not needed to accommodate a discrete capacitor, such as a surface-mount technology ("SMT") capacitor.

Figure 24:
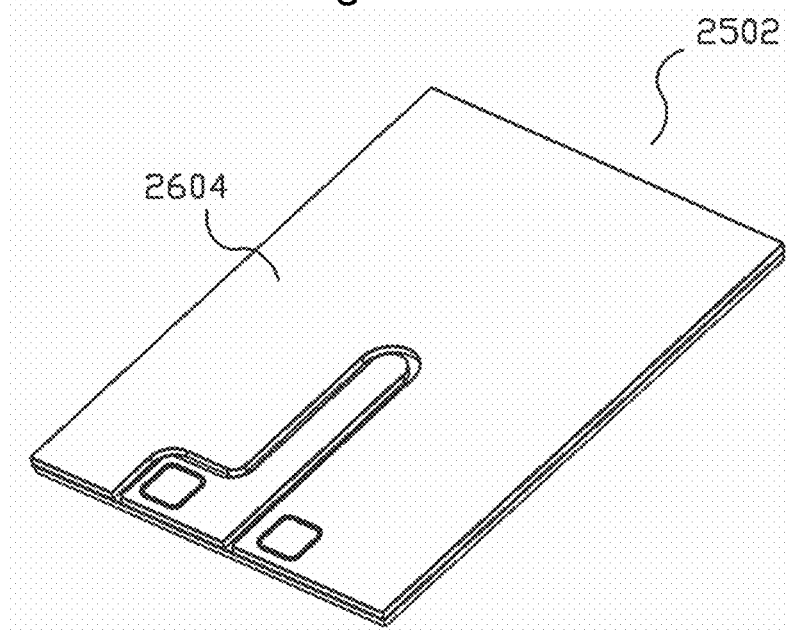
FIG. 24 illustrates a perspective view of a back surface of the embodiment of the inductive coupling coil illustrated in FIG. 21.
Figure 25:
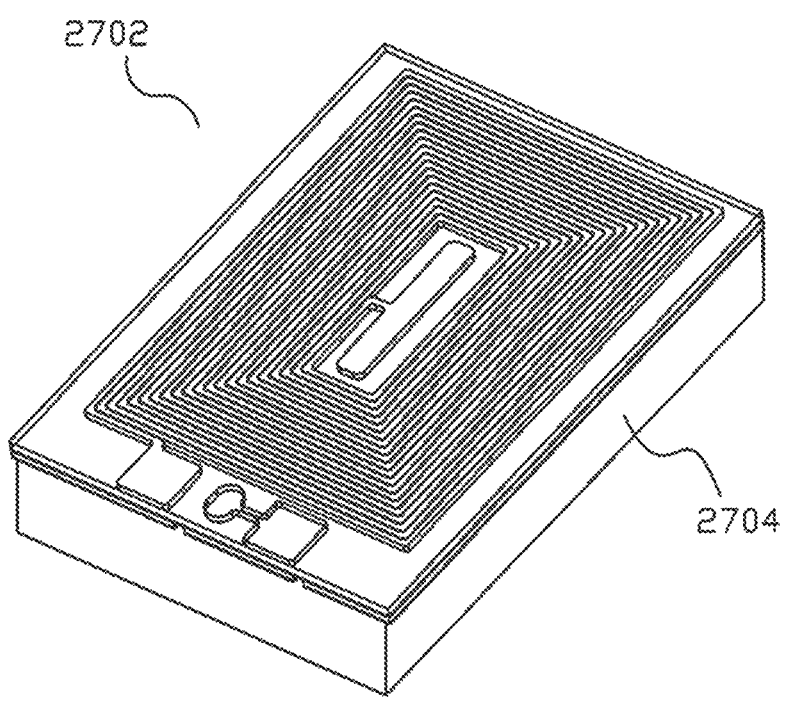
FIG. 25 illustrates a perspective view of a top surface of an inductive coupling coil 2502 according to an embodiment coupled with a radio frequency identification chip.

FIG. 24 illustrates a perspective view of a back surface 2604 of the embodiment of the inductive coupling coil 2502 illustrated in FIG. 23. FIG. 25 illustrates a perspective view of a top surface of an inductive coupling coil 2502 according to an embodiment coupled with a radio frequency identification ("RFID") chip 2704.

Figure 26A:
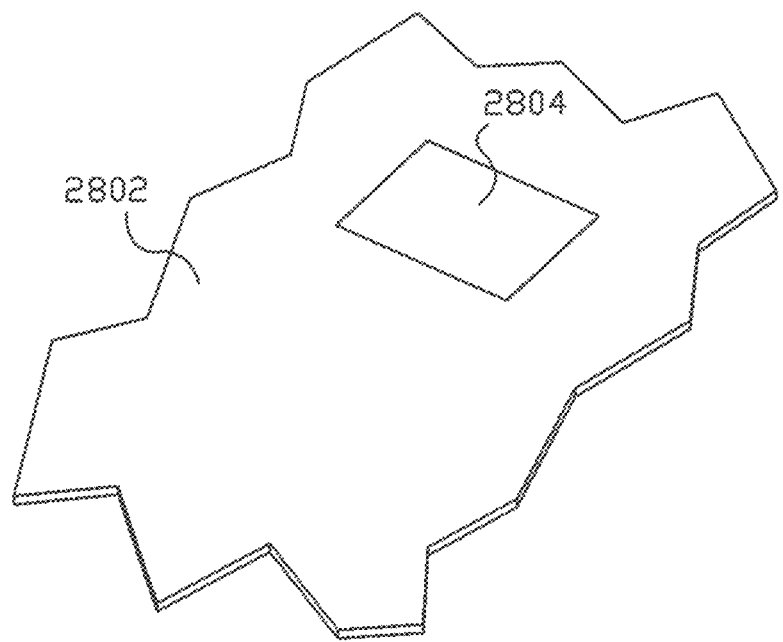
FIGS. 26a-j illustrate a method of forming an inductive coupling coil formed from high-aspect ratio electroplated structures according to an embodiment.

FIGS. 26a-j illustrate a method of forming an inductive coupling coil 2502 formed from high-aspect ratio electroplated structures 2504 according to an embodiment. According to various embodiments the inductive coupling coil includes an integrated tuning capacitor. FIG. 26a illustrates a substrate 2802 formed using techniques including those known in the art. For some embodiments, the substrate 2802 is formed of stainless steel. Other materials that can be used to for a substrate include, but are not limited to, steel alloys, copper, copper alloys, aluminum, non-conductor materials that can be metalized using techniques including plasma vapor deposition, chemical vapor deposition, and electroless chemical deposition. A shadow mask 2804 is formed over the substrate 2802. The shadow mask 2804, according some embodiments, is a high-K dielectric. Examples of high-K dielectrics that may be used include, but are not limited to, titanium dioxide ($TiO_2$), niobium oxide ($Nb_2O_5$), tantalum oxide (TaO), aluminum oxide ($Al_2O_3$), silicon dioxide ($SiO_2$), polyimide, SU-8, KMPR, and other high permittivity dielectric materials. According to some embodiments, the shadow mask 2804 is formed using a sputter process using techniques including those known in the art. The shadow mask 2804, for some embodiments, is formed to have a thickness in a range including 500 to 1000 Angstroms. For other embodiments, the shadow mask 2804 is formed using screen printing of a high-permittivity ink. An example of a high-permittivity ink includes an ink includes an epoxy loaded with particles made from one or more of titanium dioxide ($TiO_2$), niobium oxide ($Nb_2O_5$), tantalum oxide (TaO), aluminum oxide ($Al_2O_3$), silicon dioxide ($SiO_2$), polyimide, and other high-permittivity dielectric materials. For yet other embodiments, the shadow mask 2804 is formed using a slot die application of a photo imageable dielectric doped with a high-K filler. An example of a high-K filler includes zirconium dioxide ($ZrO_2$).

Figure 26B:
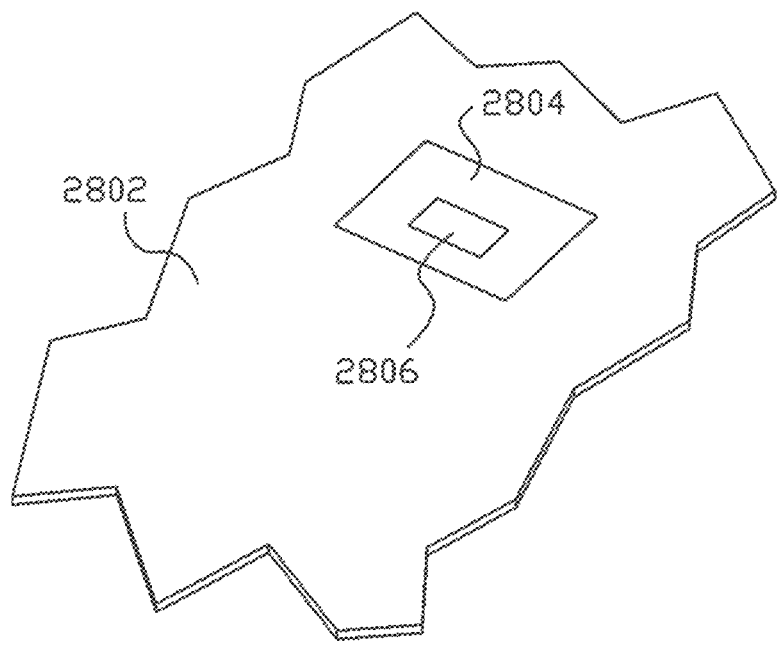

FIG. 26b illustrates a metallic capacitor plate 2806 formed over the shadow mask 2804. The metallic capacitor plate 2806 and the substrate 2802 form the two capacitor plates of the integrated capacitor. The thickness of the shadow mask 2804 can be used to set the effective capacitance of the integrated capacitor. Further, the purity of the high-K dielectric used to form the shadow mask 2804 can be used to set the effective capacitance of the integrated capacitor. The surface area of the metallic capacitor plate 2806 can also be used to set the effective capacitance of the integrated capacitor.

Figure 26C:
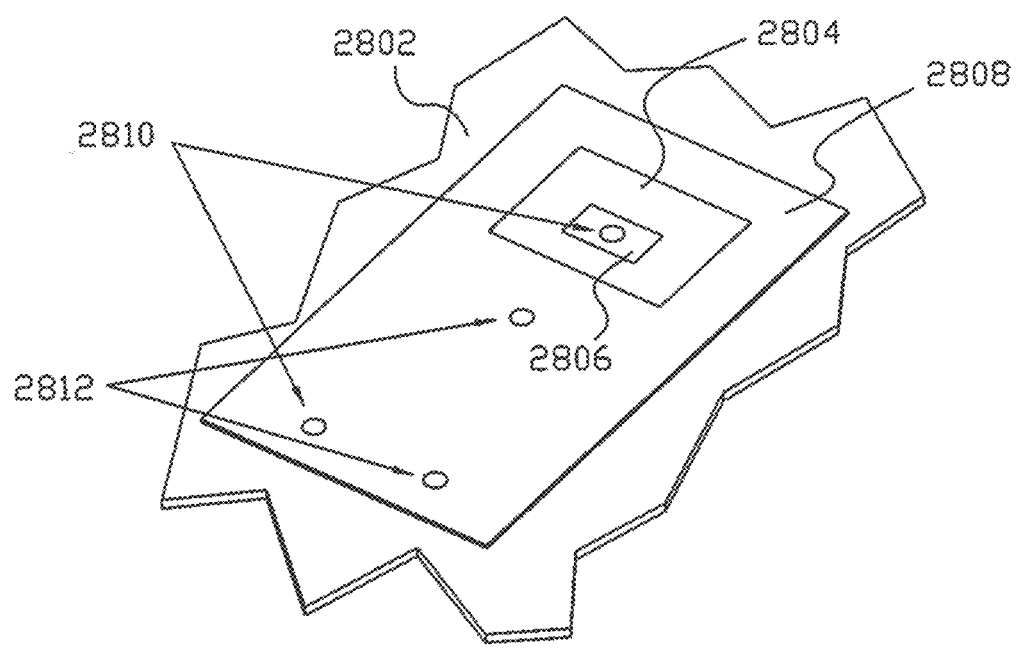

FIG. 26c illustrates a base dielectric layer 2808 formed over the shadow mask 2804, the metallic capacitor plate 2806, and at least a portion of the substrate 2802. According to some embodiments, the base dielectric layer 2808 is formed by depositing a dielectric material, patterning the dielectric material, and curing the dielectric material using techniques including those known in the art. Examples of dielectric material that can be used include, but are not limited to, polyimide, SU-8, KMPR, and a hard baked photoresists—such as that sold by IBM®. The base dielectric layer 2808 may also be patterned or etch to form vias. For example, jumper vias 2812 and shunt capacitor vias 2810 are formed in the base dielectric layer 2808. The shunt capacitor vias 2810 are formed to interconnect the integrated capacitor to the rest of the circuit to be formed. Similarly, the jumper vias 2812 are used to interconnect circuit elements to be formed to the substrate 2802.

Figure 26D:
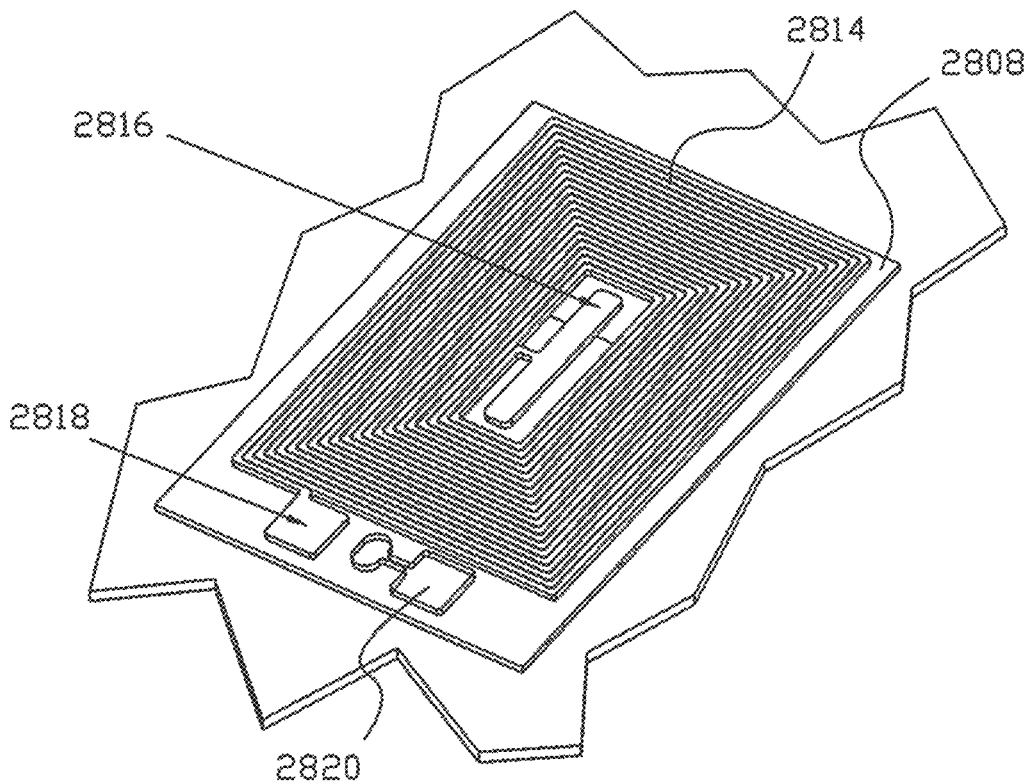

FIG. 26*d* illustrates a coil 2814 formed over the base dielectric layer 2808 using high-aspect ratio electroplated structures to form the coil using techniques including those described herein. For some embodiments, the coil 2814 is a single layer coil. The coil 2814 includes a center connect portion 2816 that connects to one of the shunt capacitor vias 2810 and one of the jumper vias 2812 that is in electrical contact with the metallic capacitor plate 2806 of the integrated capacitor. The coil 2814 also includes a capacitor connection portion 2818 to connect the coil 2814 to the other one of the shunt capacitor vias 2810 that is in electrical contact with the substrate 2802 configured as a lower plate of the integrated capacitor. According various embodiments, a terminal pad 2820 is formed of high-aspect ratio electroplated structures using techniques including those described herein. The terminal pad 2820 can be formed during the same processes used form the coil 2814.

Figure 26E:
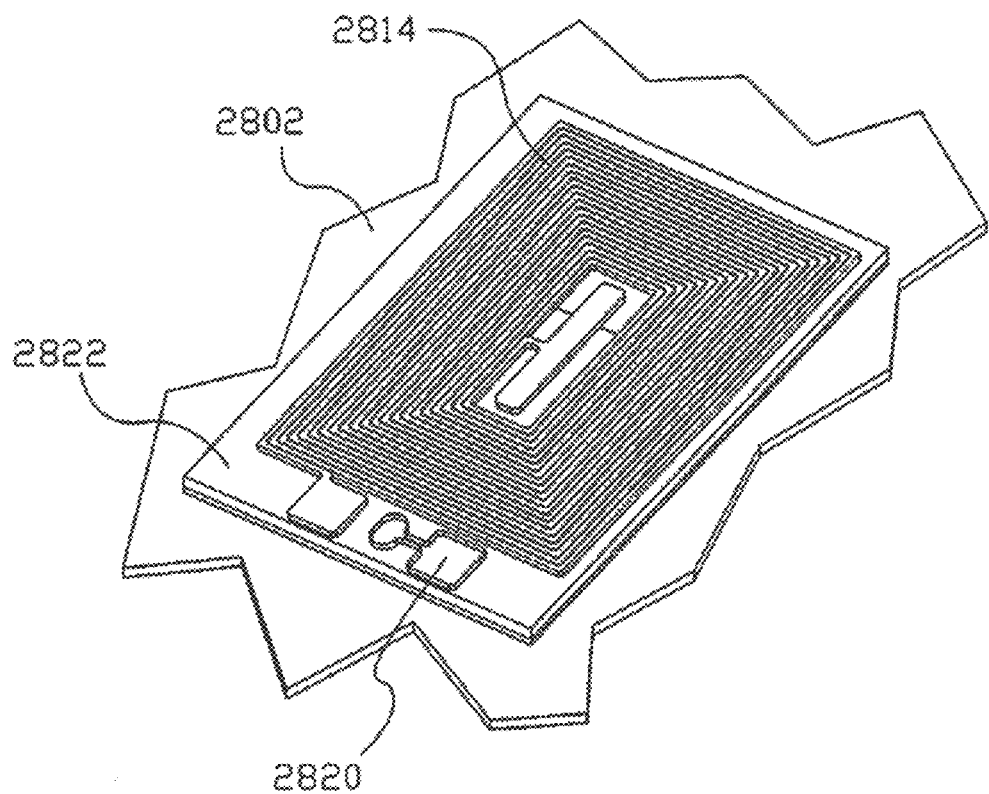

FIG. 26*e* illustrates a covercoat 2822 formed over the coil 2814, the terminal pad 2820, and the base dielectric layer 2808 to encase the coil side of the inductive coupling coil. The covercoat 2822 is formed using deposition, etching, and patterning steps including those known in the art. The covercoat 2822, for example, can be formed from polyimide solder mask, SU-8, KMPR, or epoxy.

Figure 26F:
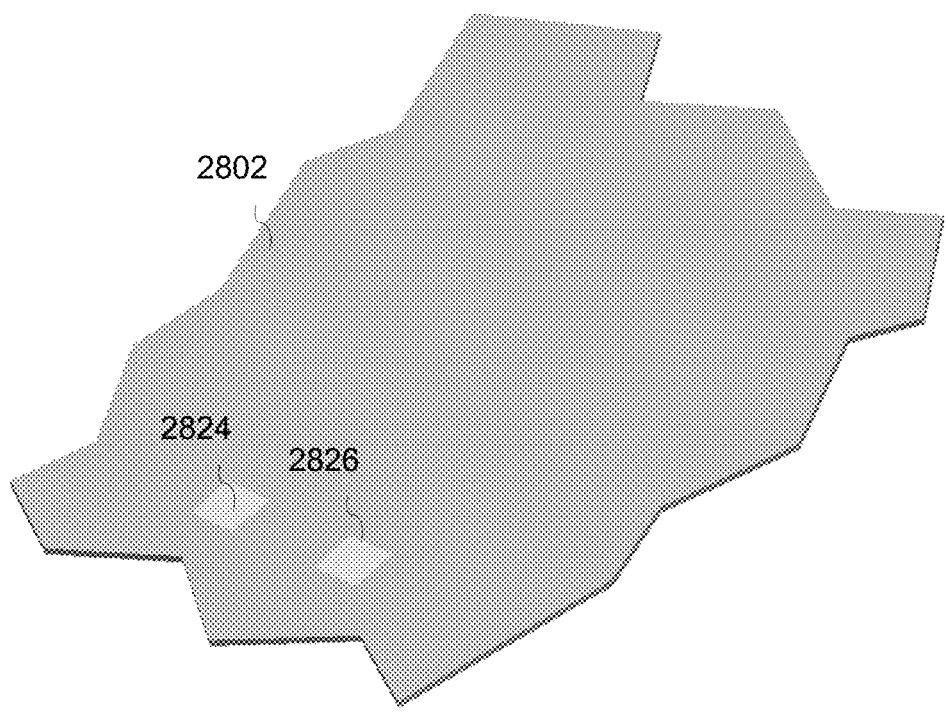

FIG. 26*f* illustrates the backside of the inductive coupling coil being formed according to an embodiment. At least a first solder pad 2824 and a second solder pad 2826 are formed on as side opposite of the substrate 2802 from the coil 2814. According to some embodiments, the first solder pad 2824 and the second solder pad 2826 are formed of gold using deposition and pattering techniques including those known in the art. The first solder pad 2824 and the second solder pad 2826 are formed to provide electrical contacts for attaching an integrated circuit chip, such as an RFID chip, to the substrate 2802.

Figure 26G:
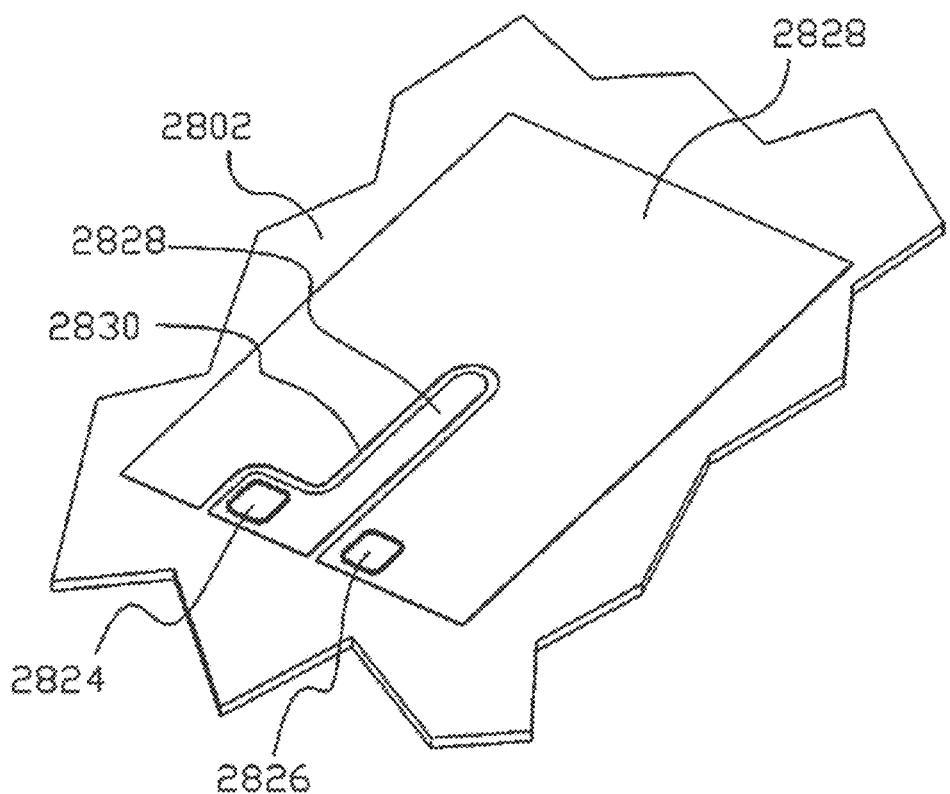

FIG. 26*g* illustrates a backside dielectric layer 2828 formed on the backside of the inductive coupling coil being formed according to an embodiment. The method of forming an inductive coupling coil may optionally include forming a backside dielectric layer 2828 on the substrate 2802. The backside dielectric layer 2828 is formed using techniques similar to those to form the base dielectric layer 2808. The backside dielectric layer 2828, according to some embodiments, is patterned to prevent a short circuit between the substrate 2802 and an attached integrated circuit chip. The backside dielectric layer 2828, according to various embodiments, is patterned to provide a jumper pattern 2830 for the substrate 2802 to be etched to form a jumper path in a subsequent step. Other patterns in the backside dielectric can be formed to also etch other portion of the substrate 2802.

Figure 26H:
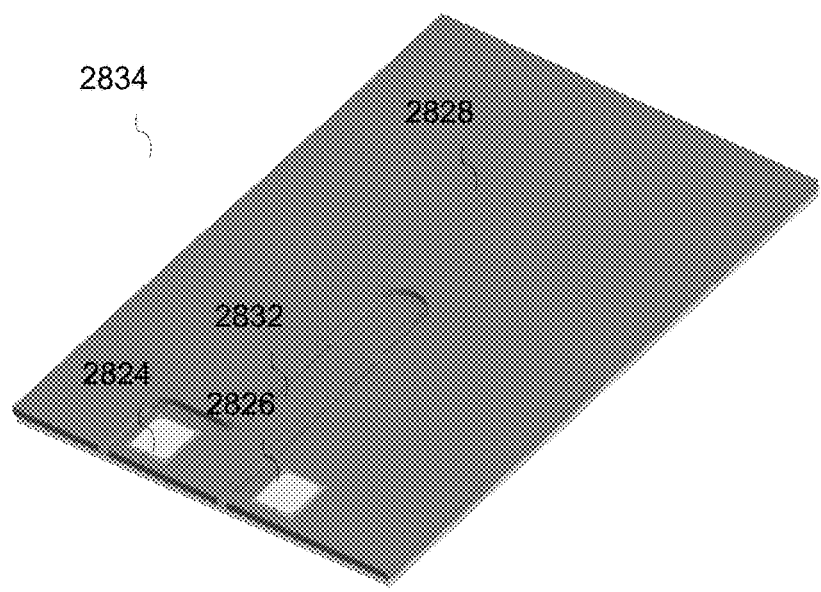
Figure 26I:
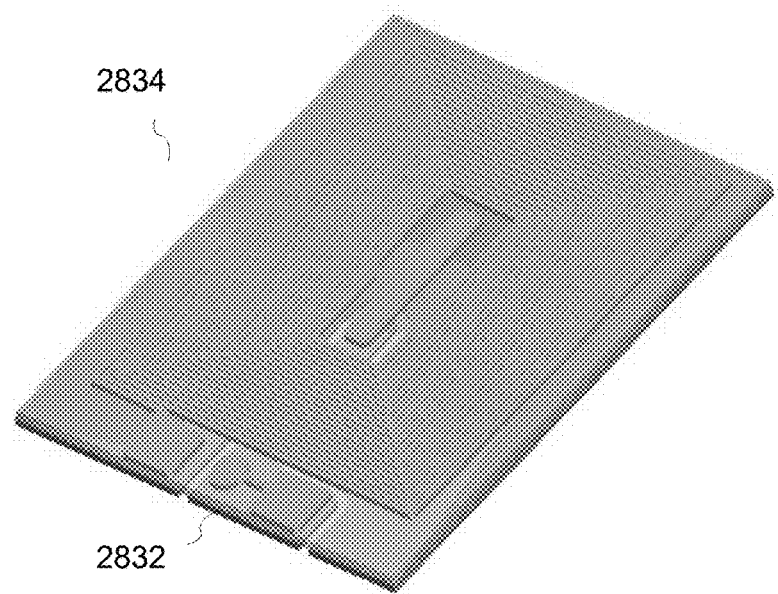

FIG. 26*h* illustrates the inductive coupling coil 2834, according to an embodiment, formed into its final shape. The portions of the substrate 2802 not covered by the backside dielectric layer 2828 are etched. Such a portion etched includes the jumper pattern 2830 to form a jumper path 2832. The etching is performed using techniques including those known in the art. One skilled in the art would understand that other portions of the substrate 2802 can be etched to form other conductive paths similar to the jumper path 2832. FIG. 26*i* illustrates the coil side of the inductive coupling coil 2834, according to an embodiment, that includes a jumper path 2832.

Figure 26J:
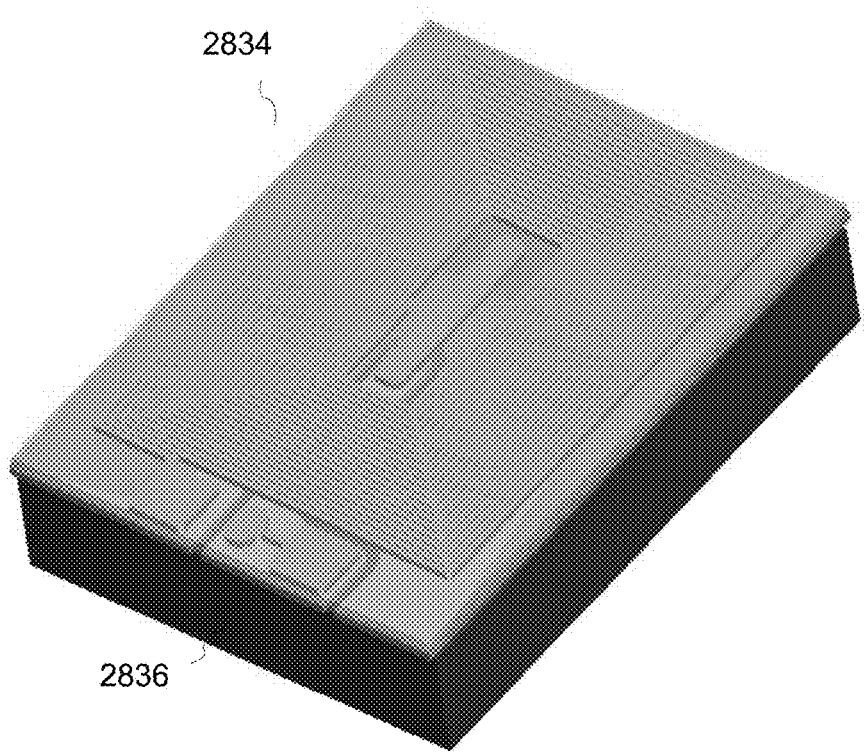

FIG. 26*j* illustrates the coil side of the inductive coupling coil 2834, according to an embodiment, that includes an integrate chip 2836 attached to the backside of the inductive coil. The method for forming the inductive coupling coil 2834 may optionally include steps to attach an integrated chip 2836, such as an RFID chip, to the inductive coupling coil 2834 using techniques including those known in the art. Such an integrated chip 2836 is attached using an adhesive including, but not limited to, conductive epoxy, solder, and other materials used to connect electrical connections.

The integration of a capacitor into devices that include high-aspect ratio electroplated structures provides the ability to take the advantage of the small footprint requirements enabled by the use high-aspect ratio electroplated structures. Other embodiments of the inductive coupling coil include inductive coupling coils that have multiple integrated capacitors. The integrated capacitors can be connected in parallel or in series as is known in the art. Other devices including high-aspect ratio electroplated structures that could also include integrated capacitors include, but are not limited to, a buck transform, signal conditioning devices, tuning devices, and other devices that would include one or more inductors and one or more capacitors.

The high-aspect ratio electroplated structures according to embodiments described herein can be used to form a device or form part of a device to optimize performance and achieve small footprints. Such devices include, but are not limited to, power converters (e.g., Buck transformer, voltage divider, AC transformer), actuators (e.g. linear, VCM), antennas (e.g., RFID, wireless power transfer for batter charging, and security chips), wireless passive coils, cell-phone and medical device battery with recharging, proximity sensors, pressure sensors, non-contact connector, micro-motor, micro-fluidics, cooling/heat-sink on a package, a long narrow flexible circuit with air core capacitance and inductance (e.g., for a catheter), interdigitated acoustic wave transducer, haptic vibrator, implantables (e.g., pacemaker, stimulators, bone growth device), magnetic resonance imaging ("MRI") device for procedures (e.g., esophageal, colonoscopy), beyond haptic (e.g., clothing, gloves), surface coated for detection/filter release, security systems, high energy density battery, inductive heating device (for small localized area), magnetic field for fluid/drug dispersion and dose delivery through channel pulses, tracking and information device (e.g., agriculture, food, valuables), credit card security, sound systems (e.g., speaker coils, recharging mechanism in headphones, earbuds), thermal transfers, mechanical-thermal conductive seal, energy harvester, and interlocking shapes (similar to hook and loop fasteners). In addition, the high-aspect ratio electroplated structures as described herein can used to form high bandwidth, low impedance interconnects. The use of the high-aspect ratio electroplated structures in the interconnects can be used to improve electrical characteristics (e.g., resistance, inductance, capacitance), improve heat transfer properties, and customize dimensional requirements (thickness control). The interconnects including the high-aspect ratio electroplated structures as described herein can be used to tune the bandwidth of one or more circuits for a given frequency range. Other interconnect applications including the high-aspect ratio electroplated structures can integrate one or more circuits of varying currents (signal and power for example). The use of high-aspect ratio electroplated structures allows circuits having different cross sections, allows some to have more current carrying capability, to be fabricated together in close proximity to maintain a condensed overall package size. The high-aspect ratio electroplated structures can also be used in interconnects for mechanical purposes. For example it may be desirable to have some regions of the circuit protrude above others to serve as a mechanical stop, bearing, electrical contact zone, or for added stiffness.

Figure 27:
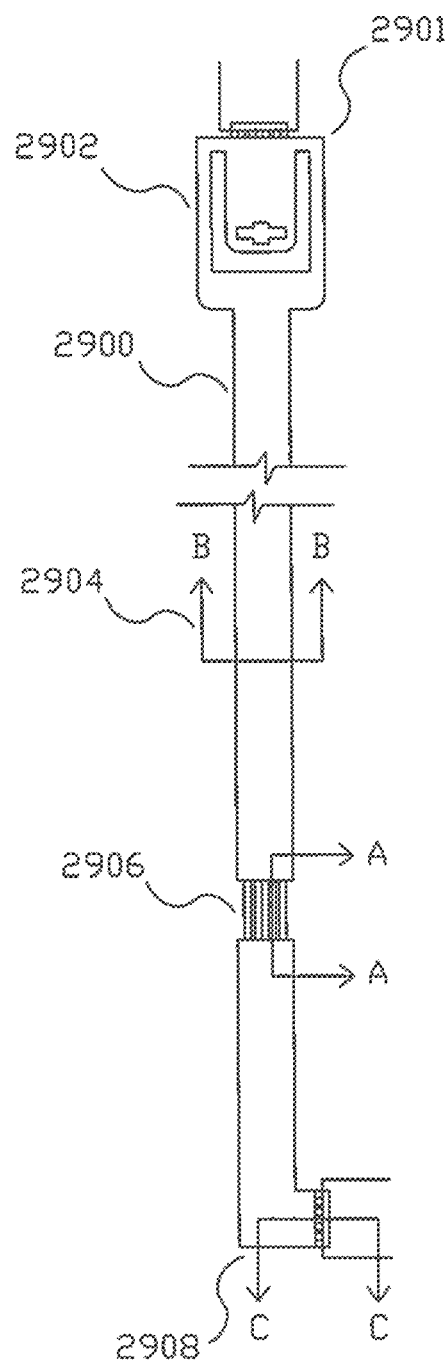
FIG. 27 illustrates plan view of a flexure for a suspension for a hard disk drive including high-aspect ratio electroplated structures according to an embodiment.

FIG. 27 illustrates plan view of a flexure for a suspension for a hard disk drive including high-aspect ratio electroplated structures according to an embodiment. The flexure 2900 includes a distal portion 2901, a gimbal portion 2902, a middle portion 2904, a gap portion 2906, and a proximal portion 2908. The proximal portion 2908 is configured to attached to a baseplate such that the distal portion 2901 extends over spinning disk media. The gimbal portion 2902, according to some embodiments, is configured to include one or more motors, such as a piezoelectric motor, and one or more electrical components, such as a head slider for reading or writing to the disk media, and components for heat-assisted magnetic recording ("HAMR")/thermally-assisted magnetic recording ("TAMR") or microwave assisted magnetic recording ("MAMR"). The one or more motors and one or more electrical components are electrically connected to other circuitry though one or more traces formed on a conductor layer of the flexure that extends from the distal portion 2901 of the flexure 2900 through the middle portion 2904 over a gap portion 2906 and beyond the proximate portion 2908. The gap portion 2906 is a portion of the flexure where the substrate layer, such as a stainless steel layer, is partially of completely removed. Thus, one or more of the traces in the conductor layer of the flexure extend over the gap portion 2906 without any support. One skilled in the art would understand that a flexure may have one or more gap portions 2906 at any location along the flexure.

Figure 28:
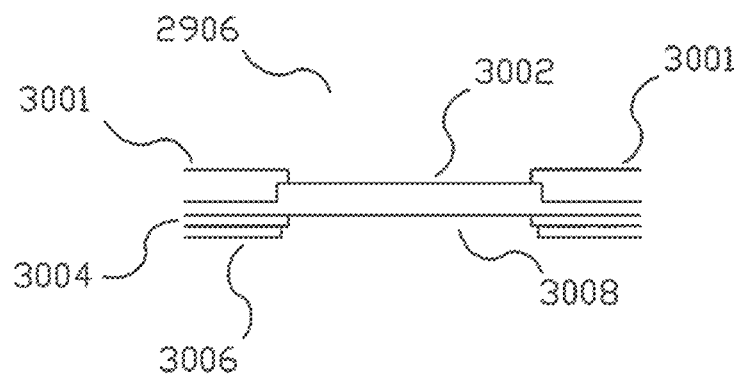
FIG. 28 illustrates a cross-section of a gap portion of a flexure at a gap portion taken along the line A as illustrated in FIG. 27.

FIG. 28 illustrates a cross-section of a gap portion of a flexure at a gap portion taken along the line A as illustrated in FIG. 27. The gap portion 2906 includes a trace 3002 disposed over a dielectric layer 3004. The dielectric layer, such as a polyimide layer, is disposed over a substrate 3006, such as a stainless steel layer. The substrate 3006 and the dielectric layer 3004 define a void 3008 such that the trace 3002 extends over the void 3008. The trace 3002 includes a metal crown portion to form a high-aspect ratio structure. The metal crown portion are formed selectively on trace 3002 using techniques described herein. The metal crown portion are formed on trace 3002 to provide additional strength to span the void 3008 and when used to electrically couple with interconnects at the region of the void 3008.

Figure 29:
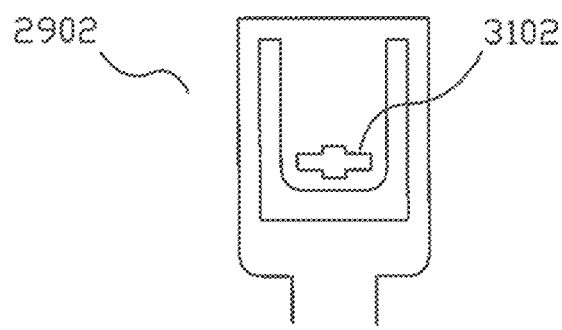
FIG. 29 illustrates a gimbal portion with a mass structure according to an embodiment.

FIG. 29 illustrates a gimbal portion 2902 with a mass structure 3102 according to an embodiment. The mass structure 3102 is formed using high-aspect ratio electroplated structures using techniques described herein. For some embodiments, the mass structure 3102 is used as a weight to tune the resonance of the gimbal portion 2902. Thus, the shape, size, and location of the mass structure 3102 can be determined to tune the resonance of the gimbal portion 2902 to enhance the performance of a hard drive suspension. The processes described herein used to form the high-ratio aspect structures can be used to maintain the size of the high-aspect ratio structures such that the resonance can be fine tuned. Moreover, the processes are capable of forming high-ratio aspect structures at dimensions beyond the capabilities of current lithography process enabling more control over the final structure formed.

Mass structure 3102 can also be configured to use as a mechanical stop. For example, one or more mechanical stops can be formed into any shape to act as a backstop and/or used to align the mounting of a component on the gimbal portion 2902 or other portion of a flexure.

Figure 30:
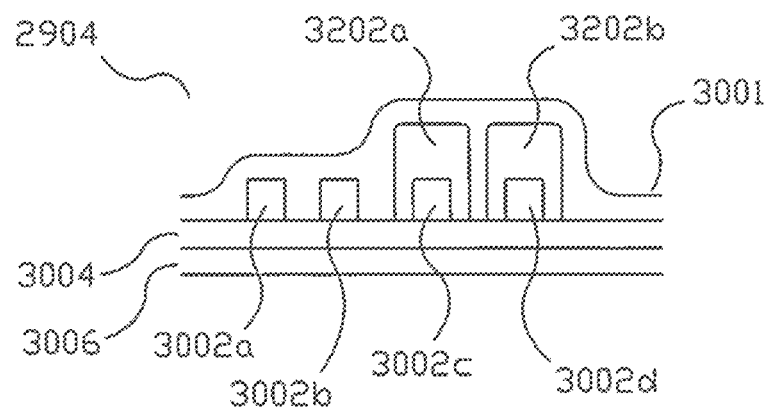
FIG. 30 illustrates a cross section of a proximal portion of a flexure including high-aspect ratio electroplated structures according to an embodiment, taken along line B as illustrated in FIG. 27.

FIG. 30 illustrates a cross section of a proximal portion of a flexure including high-aspect ratio electroplated structures according to an embodiment, taken along line B as illustrated in FIG. 27. The proximal portion 2904 includes a conductor layer including traces 3002*a,b,c,d* disposed over a dielectric layer 3004. The dielectric layer 3004 is disposed over a substrate 3006. A cover layer 3001 is disposed over the conductor layer and the dielectric layer. The conductor layer includes conventional traces 3002*a,b* and traces 3002*c,d* formed with at least a portion of the traces including a metal crown portion 3202*a,b* to form a high-aspect ratio electroplated structure using techniques described herein. One or more portions of traces 3002*a,b,c,d* can be formed to include metal crown portions 3202*a,b* to tune the impedance of each trace. For example, the resistance of the trace can be tuned as needed to meet desired performance characteristics. Another example, include using the metal crown portion to tune impedance by closing the distance between adjacent traces 3002*a,b,c,d*.

Figure 31:
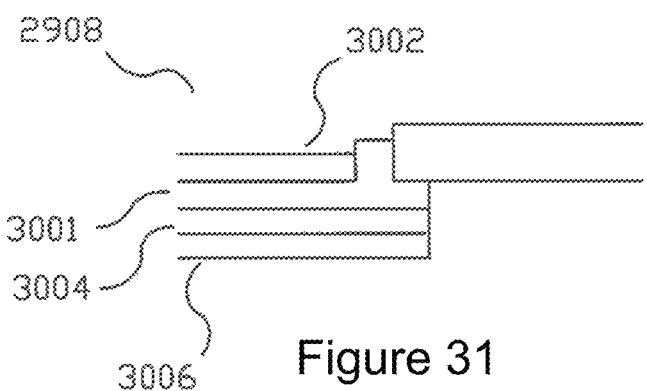
FIG. 31 illustrates a cross section of a proximate portion of a flexure including high-aspect ratio structures according to an embodiment, taken along line C as illustrated in FIG. 27.
Figure 32:
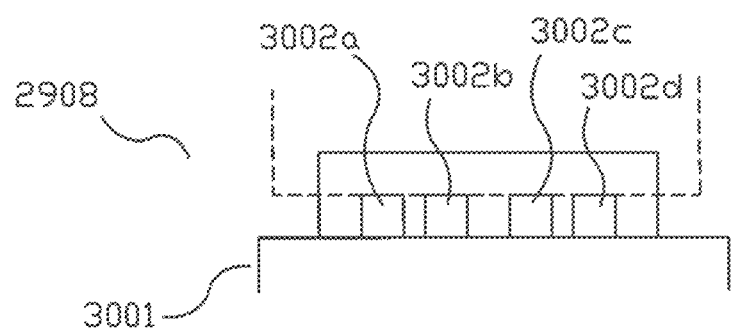
FIG. 32 illustrates a plan view of the proximate portion of the flexure including high-aspect ratio structures according to an embodiment.

FIG. 31 illustrates a cross section of a proximate portion of a flexure including high-aspect ratio structures according to an embodiment, taken along line C as illustrated in FIG. 27. The proximate portion of the flexure includes a conductor layer including at least a trace 3002 disposed over a dielectric layer 3004. The dielectric layer 3004 disposed on the substrate 3008. Further, a cover layer 3001 is disposed over the formed to include a metal crown portion to form a high-aspect ratio electroplated structure using techniques described herein. The trace 3002 is configured as a high-aspect ratio structure to match the impedance of the trace with a terminating connector and to provide strength to the joint electrically coupling the trace 3002 with the connector. FIG. 32 illustrates a plan view of the proximate portion 2908 of the flexure including high-aspect ratio structures according to an embodiment. The use of high-aspect ratio structures as described with reference to use with a flexure are also applicable with other circuit board technologies, for example for use in microcircuits and radio frequency ("RF") circuits.

Although described in connection with these embodiments, those of skill in the art will recognize that changes can be made in form and detail without departing from the spirit and scope of the invention.

What is claimed is:

1. A method for manufacturing a metal structure comprising:
   providing a substrate having a first trace having an initial height to width aspect ratio, wherein a first dielectric layer is formed using a thin dielectric process disposed over the substrate;
   electroplating a metal crown on at least the first trace to form the metal crown with a final height to width aspect ratio greater than the initial height to width aspect ratio of the first trace, wherein the metal crown is formed over at least a portion of the first trace on a top surface and sidewalls of the first trace, wherein a distance between the first trace to a second trace disposed on the substrate tunes an impedance of the first trace, wherein the first dielectric layer fills spaces between the first trace and the second trace and provides a coating over the first trace and the second trace, wherein the electroplating comprises:
   adjusting a current density based on an amount of copper and/or an amount of leveler additive to the plating solution included in a plating bath, wherein the metal crown is selectively formed over at least the portion of the first trace based on a concentration of a metal in the plating bath or a current density of the plating bath;

forming at least a third trace and a fourth trace over the first dielectric layer; and forming a second dielectric layer over the third trace and the fourth trace using the thin dielectric process to fill spaces between the third trace and the fourth trace and coat over the third trace and the fourth trace, wherein a thickness of the second dielectric layer between a top of the second dielectric layer and a top of the third trace and the fourth trace is less than a thickness of the first dielectric layer between the first dielectric layer and the substrate.

2. The method of claim 1, wherein electroplating the metal crown includes depositing metal on upper portions and side portions of the first trace, and wherein a rate of deposition on the upper portions of the first trace is greater than a rate of deposition on side portions of the first trace.

3. The method of claim 1, wherein electroplating the metal crown includes depositing metal substantially only on upper portions of the first trace.

4. The method of claim 1, wherein electroplating includes electroplating to form the metal structure where the final height to width aspect ratio is greater than or equal to 1.2.

5. The method of claim 1, wherein electroplating includes electroplating to form the metal structure where a height of the metal structure is greater than twice a height of the first trace.

6. The method of claim 1, wherein electroplating includes electroplating to form the metal structure where a width of the metal structure is less than or equal to twice a width of the first trace.

7. The method of claim 1, further comprising:

forming two or more adjacent structures adjacent to the substrate, and wherein a spacing between the two or more adjacent structures before the electroplating is less than or equal to 1.5 times the width of the first trace and the second trace.

8. The method of claim 1, wherein providing the substrate having the first trace includes electroplating the first trace onto the substrate.

9. The method of claim 1, wherein providing the substrate having the first trace includes:

providing a laminate including a substrate and a metal layer optionally separated by an insulating layer; and etching the metal layer to form the first trace.

10. The method of claim 1, wherein electroplating the metal crown includes:

a conformal electroplating phase using a first current density; and an anisotropic electroplating phase using a second current density that is greater than the first current density, after the conformal electroplating phase.

11. The method of claim 1, wherein the metal structure is used for manufacturing products including integrated lead flexures, coils including multi-layer and helical coils and/or camera lens suspension components.

12. The method of claim 1, wherein electroplating includes electroplating to form the metal structure where the final height to width aspect ratio is greater than or equal to 2.0.

13. The method of claim 1, wherein electroplating includes electroplating to form the metal structure where a height of the metal structure is greater than or equal to 2.4 times a height of the first trace.

14. The method of claim 1, wherein electroplating includes electroplating to form the metal structure where a width of the metal structure is less than or equal to 1.7 times a width of the first trace.

15. The method of claim 1, further comprising:

forming two or more adjacent metal structures on the substrate, and wherein a spacing between the two or more adjacent metal structures before the electroplating is less than or equal to about 1.0 times a width of the first trace and the second trace.

16. The method of claim 1, wherein the substrate is a metal.

17. The method of claim 1, wherein the substrate is a polymer.

18. The method of claim 1 wherein the thin dielectric process includes use of liquid photosensitive polyimide.

* * * * *